(12) United States Patent
Hong et al.

(10) Patent No.: US 11,342,257 B2
(45) Date of Patent: May 24, 2022

(54) CARRIER BOARD AND POWER MODULE USING SAME

(71) Applicant: Delta Electronics (Shanghai) Co., Ltd., Shanghai (CN)

(72) Inventors: Shouyu Hong, Shanghai (CN); Haibin Xu, Shanghai (CN); Tao Wang, Shanghai (CN); Yan Tong, Shanghai (CN); Weicheng Zhou, Shanghai (CN); Ganyu Zhou, Shanghai (CN); Qingdong Chen, Shanghai (CN); Zhenqing Zhao, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 17/154,170

(22) Filed: Jan. 21, 2021

(65) Prior Publication Data
US 2021/0225753 A1    Jul. 22, 2021

(30) Foreign Application Priority Data

Jan. 22, 2020    (CN) .......................... 202010075506.4
Jan. 18, 2021    (CN) .......................... 202110064816.0

(51) Int. Cl.
| H05K 1/02 | (2006.01) |
| H01L 23/498 | (2006.01) |
| H01L 23/538 | (2006.01) |
| H01L 25/16 | (2006.01) |
| H01L 23/14 | (2006.01) |

(52) U.S. Cl.
CPC .... *H01L 23/49838* (2013.01); *H01L 23/5386* (2013.01); *H01L 25/16* (2013.01); *H01L 23/142* (2013.01)

(58) Field of Classification Search
CPC ......... H05K 1/0263; H05K 2201/0792; H05K 2201/10166; H05K 2201/10416
USPC .......................................................... 361/712
See application file for complete search history.

(56) References Cited

U.S. PATENT DOCUMENTS

| 5,339,519 A | 8/1994 | Fortune |
| 2002/0185718 A1 | 12/2002 | Mikubo et al. |
| 2004/0107569 A1 | 6/2004 | Guzek et al. |

(Continued)

FOREIGN PATENT DOCUMENTS

| CN | 101653053 B | 4/2012 |
| CN | 106298758 B | 2/2019 |
| JP | 6206338 B2 | 10/2017 |

*Primary Examiner* — Sherman Ng
(74) *Attorney, Agent, or Firm* — Kirton McConkie; Evan R. Witt

(57) ABSTRACT

A carrier board and a power module using the same are disclosed. The carrier board includes a main body, two metal-wiring layers and at least one metal block. The main body includes at least two terminals and a surface. The two terminals are disposed on the surface. The two metal-wiring layers are disposed on the main body to form two parts of metal traces connected to the two terminals, respectively. The at least one metal block is embedded in the main body and connected to one of the two terminals. A thickness of the two parts of metal traces is less than that of the metal block. The two terminals connected by the two parts of metal traces have a loop inductance less than or equal to 1.4 nH calculated at a frequency greater than 1 MHz.

29 Claims, 49 Drawing Sheets

(56) References Cited

U.S. PATENT DOCUMENTS

| | | |
|---|---|---|
| 2004/0113268 A1 | 6/2004 | Shirakawa et al. |
| 2010/0065962 A1 | 3/2010 | Bayerer et al. |
| 2012/0106220 A1 | 5/2012 | Yamaguchi et al. |
| 2013/0043584 A1 | 2/2013 | Kwon et al. |
| 2013/0337648 A1* | 12/2013 | Lin .................. H01L 21/4857 |
| | | 438/675 |
| 2014/0104801 A1 | 4/2014 | Saji et al. |
| 2014/0183550 A1 | 7/2014 | Reusch et al. |
| 2014/0210569 A1 | 7/2014 | Tasaka et al. |
| 2016/0133558 A1* | 5/2016 | Stahr ................ H01L 23/3121 |
| | | 257/692 |
| 2016/0172291 A1* | 6/2016 | Kim ................ H01L 23/49827 |
| | | 257/738 |
| 2017/0194200 A1 | 7/2017 | Bayerer |
| 2017/0229953 A1 | 8/2017 | Otake |
| 2018/0294250 A1* | 10/2018 | Kouno ............. H01L 23/49562 |
| 2019/0287948 A1 | 9/2019 | Oomori |
| 2019/0371688 A1 | 12/2019 | Saito et al. |
| 2019/0371773 A1 | 12/2019 | Oomori |

* cited by examiner

CARRIER BOARD AND POWER MODULE USING SAME

CROSS-REFERENCE TO RELATED APPLICATION

This application claims priorities to China Patent Application No. 202010075506.4, filed on Jan. 22, 2020, and China Patent Application No. 202110064816.0, filed on Jan. 18, 2021. The entire contents of the above-mentioned patent applications are incorporated herein by reference for all purposes.

FIELD OF THE INVENTION

The present disclosure relates to the field of power electronics, and more particularly to a carrier board and a power module using the same.

BACKGROUND OF THE INVENTION

As an important part of power conversion, modern power electronic equipment is widely used in the power, electronics, motor and energy industries. Ensuring long-term stable operation of power electronic equipment and improving power conversion efficiency of power electronic equipment have been an important goal of those skilled in the art.

As the core component of modern power electronic equipment, power semiconductor devices directly determine the reliability and power conversion efficiency of power electronic equipment. In order to design a reliable, safe, and high-performance power electronic equipment, it is desirable that the power semiconductor device has low voltage stress and low power loss. Power semiconductor devices used in power electronic equipment operate in a switching mode, and high frequency switching will induce a high current change rate di/dt in the wires. Therefore, a voltage Vs is caused by the changed current applied on the stray inductance Ls and is calculated as followed.

$$Vs = Ls \times di/dt$$

Therefore, a higher voltage spike is caused by larger stray inductance when the current change rate keeps in constant. The voltage spike will reduce the reliability of the device and increase turn-off-loss of the device. The device is allowed to switch faster with smaller gate resistance as the stray inductance is reduced, which have lower switching loss and higher efficiency of the converter. Moreover, the voltage spikes not only affect the efficiency, but also cause the electromagnetic interference problems.

At the same time, due to the unavoidable presence of parasitic inductance in the power loop, the high switching frequency of the power device causes a rapid voltage change, which will cause the EMI in the circuit to exceed the standard.

In addition, the performance and the thermal management of a power semiconductor device are closely related to each other. Good thermal management is essential to improve the conversion efficiency, power density and reliability of power devices. The reasons are as the following. (1) At a lower operating temperature, the on-state losses of a power device such as MOSFET and IGBT will be reduced, and it is beneficial to the improvement of system efficiency. (2) In many cases, the power density is directly determined according to the magnitude of heat energy, because the power converter is a system used to process power conversion. Generally, a semiconductor device is the device with a lot of losses, and the tolerable temperature of the semiconductor device is limited within a certain range. If the semiconductor device is operated over the limitation, the working ability of the semiconductor device might be lost, or the performance of the semiconductor device might be deteriorated sharply. Therefore, the heat dissipation system is required to control the temperature of the semiconductor chip within an acceptable range. (3) Generally, the cost of heat dissipation accounts for a large proportion of the system cost. (4) The life of the semiconductor device is closely related to the operating temperature. In the electronics field, there is usually such engineering experience that the life is reduced by half when the operating temperature is raised by 10 degrees. A lower operating temperature can effectively extend the lifespan of the device.

On the other hand, the output capacitance of the power device, such as the capacitance between the drain and the source of the MOSFET device, has a great influence on the switching loss of the power device. In order not to increase the switching loss, when the wiring relationship of each component is configured, it is also necessary to reduce the output capacitance of the power device.

Therefore, there is a need of providing a carrier board and a power module using the same to obviate the drawbacks encountered by the prior arts and achieve the purpose of reducing the parasitic inductance and the EMI and improving the heat dissipation at the same time.

SUMMARY OF THE INVENTION

An object of the present disclosure is to provide a carrier board and a power module using the same. By optimizing the arrangement of each component, the purpose of reducing the parasitic inductance and the EMI is achieved. It facilitates the power module structure to be assembled easily and firmly. At the same time, it is beneficial to reduce the volume of the power module and improve the entire power density of the power module.

Another object of the present disclosure is to provide a carrier board and a power module using the same. By utilizing a carrier board including two metal-wiring layers and at least one metal block to connect two switches in series to form a bridge arm, the area of the high-frequency loop is reduced, and the corresponding loop parasitic inductance is reduced. In addition, when the bridge arm formed by the two switches and a clamping component of the power module are electrically connected in parallel on the carrier board through the two metal-wiring layers, it is helpful for reducing the clamping inductance in the power module. With the at least one metal block embedded in the carrier board, it is more helpful for improving the heat dissipation performance of the power module. By partially overlapping the projections of the at least two metal-wiring layers, the at least one metal block and the two switches connected to each other in series on the surface of the carrier board, two high frequency loops decoupled from each other are formed, and the parasitic inductance in the two high-frequency loops is reduced. The current of one first high-frequency loop flows through the metal-wiring layer on the surface of the carrier board, and the current of another high-frequency loop crosses through the metal-wiring layer on the surface of the carrier board. Notably, the current that flows through the metal-wiring layer in the horizontal direction can be ignored. At least, the two high-frequency loops are partially decoupled, and the mutual influence is eliminated. Moreover, it is easy to realize the connection of the carrier board with the bridge arm including the two series-connection switches. It is beneficial for reducing the cost and enhancing the reliability. Since the bridge arm including two series-connection switches is disposed on the carrier board including at least one metal block embedded therein, it facilities the power module to combine with two heat dissipation devices to achieve the double-sided heat dissipation and reduce the thermal resistance. Furthermore, the purposes of reducing the costs, enhancing the reliability of the power module and improving the heat-dissipation capacity are achieved. The metal-wiring layer on the surface of the carrier board can be realized with a thinner thickness, and combined with the metal block prefabricated and embedded in the carrier board to reduce the manufacturing costs and further enhance the reliability of the carrier board. When the two switches and the clamping component of the power module are directly disposed on the carrier board, it is beneficial for simplifying the assembly structure, reducing the cost, simplifying the manufacturing process, and improving the yield and reliability of the product.

A further object of the present disclosure is to provide a power module. By arranging the metal conductive component on the side of the switches and the clamping component away from the carrier board, the metal conductive component is kept away from the trace of carrier board, which connects the switches and the clamping component to the positive terminal and the negative terminal therethrough, so that the output capacitance formed by the switches of the power module is reduced, and the parasitic inductances in the two high frequency loops are eliminated. An optimized power module is achieved. Moreover, the metal conductive component and the bridge arm including two switches connected in series can be prefabricated into an integrated structure, and the connection with the carrier board is easy to realize. It is beneficial for reducing the cost and enhancing the reliability. Two switches are connected to each other in series to form a bridge arm and disposed on the carrier board, and the bridge arm is formed by connecting two switches in series through the metal conductive component. Moreover, the bridge arm is connected with the clamping component in parallel through the carrier board, so as to form two high frequency loops decoupled from each other. Since the two high frequency loops are partially decoupled, the mutual influence is eliminated. Moreover, the metal-wiring layer on the surface of the carrier board can be realized with a thinner thickness, and combined with an integrated structure prefabricated by the metal conductive component and the two switches, so as to reduce the manufacturing costs. When the two switches and the metal conductive component of the power module are directly disposed on the carrier board, it is beneficial for simplifying the assembly structure, reducing the cost, simplifying the manufacturing process, and improving the yield and reliability of the product.

In accordance with an aspect of the present disclosure, there is provided a carrier board. The carrier board includes a main body, at least two metal-wiring layers and at least one metal block. The main body includes at least two terminals and at least one surface. The at least two terminals are disposed on the at least one surface. The at least two metal-wiring layers are disposed on the main body to form at least two parts of metal traces, which are connected to the at least two terminals, respectively. The at least one metal block is embedded in the main body, spatially corresponds to and is connected to one of the at least two terminals. A thickness of the at least two parts of metal traces is less than a thickness of the at least one metal block. The at least two terminals connected by the at least two parts of metal traces have a loop inductance, which is less than or equal to 1.4 nH when the loop inductance is calculated at a frequency greater than 1 MHz. The carrier board is helpful for reducing the clamping inductance in the power module and improving the heat dissipation performance.

In accordance with an aspect of the present disclosure, there is provided a power module. The power module includes a carrier board and two switches. The carrier board includes a main body, at least two metal-wiring layers and at least one metal block. The main body includes at least two terminals, an upper surface and a lower surface. The at least two terminals are disposed on the upper surface. The at least two metal-wiring layer are disposed on the main body to form at least two parts of metal traces, which are connected to the at least two terminals, respectively. The at least one metal block is embedded in the main body, spatially corresponds to and is connected to one of the at least two terminals. A thickness of the at least two parts of metal traces is less than a thickness of the at least one metal block. Two switches are disposed on the upper surface and connected to each other in series through the at least two terminals to form a bridge arm. A projection of the at least one metal block on the lower surface is at least partially overlapped with a projection of the two switches on the lower surface.

In accordance with an aspect of the present disclosure, there is provided a power module. The power module includes a carrier board, a first switch, a second switch, at least one metal block, a clamping component and a metal conductive component. The carrier board includes an upper surface, a lower surface, a positive terminal and a negative terminal. The first switch and the second switch are disposed on the upper surface and connected to each other in series to form a bridge arm electrically connected between the positive terminal and the negative terminal. The at least one metal block is disposed between the upper surface and the lower surface, and electrically connected to the first switch and/or the second switch. The clamping component is disposed on the upper surface and electrically connected in parallel with the bridge arm through the carrier board. The metal conductive component is connected from a common node of the first switch and the second switch to an output terminal. The metal conductive component is located at a side of the first switch and the second switch facing away from the upper surface.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

Figure 1A:
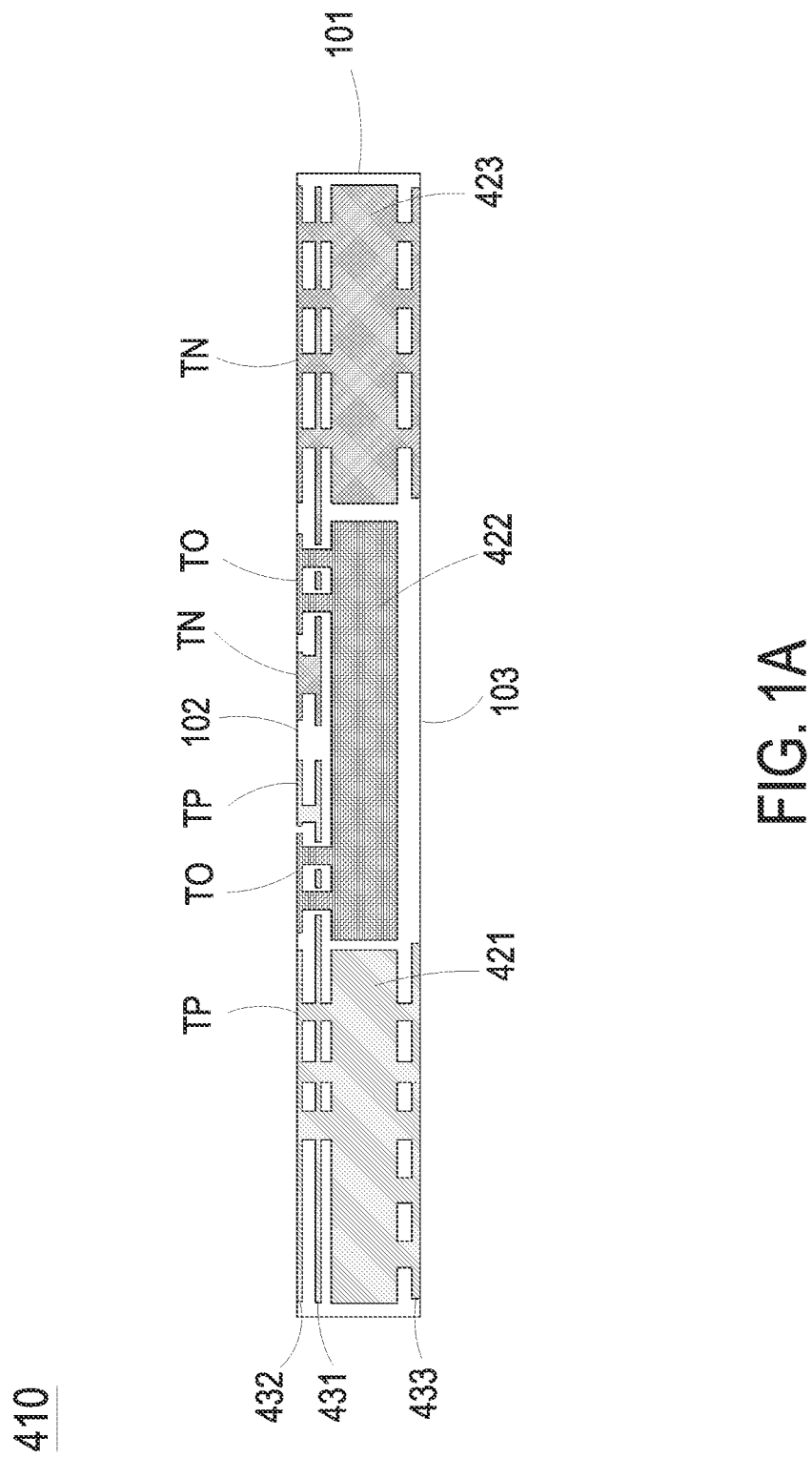
FIG. 1A is a schematic cross-sectional view illustrating a carrier board according to an embodiment of the present disclosure.

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "coupled," to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments. Besides, "and/or" and the like may be used herein for including any or all combinations of one or more of the associated listed items. Alternatively, the word "about" means within an acceptable standard error of ordinary skill in the art-recognized average. In addition to the operation/working examples, or unless otherwise specifically stated otherwise, in all cases, all of the numerical ranges, amounts, values and percentages, such as the number for the herein disclosed materials, time duration, temperature, operating conditions, the ratio of the amount, and the like, should be understood as the word "about" decorator. Accordingly, unless otherwise indicated, the numerical parameters of the present invention and scope of the appended patent proposed is to follow changes in the desired approximations. At least, the number of significant digits for each numerical parameter should at least be reported and explained by conventional rounding technique is applied. Herein, it can be expressed as a range between from one endpoint to the other or both endpoints. Unless otherwise specified, all ranges disclosed herein are inclusive.

Figure 1B:
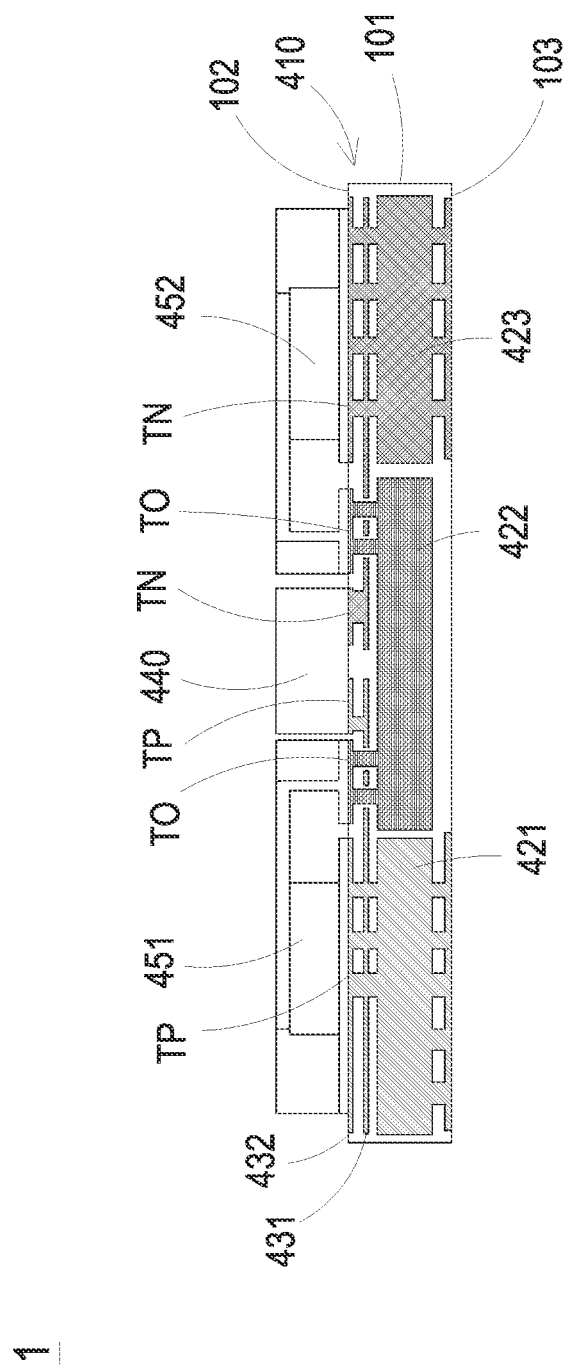
FIG. 1B is a schematic cross-sectional view illustrating a power module according to a first embodiment of the present disclosure.

In order to achieve low parasitic inductance and good heat dissipation of a power devices or systems, the present disclosure provides a carrier board and a power module using the same. FIG. 1A is a schematic cross-sectional view illustrating a carrier board according to an embodiment of the present disclosure. FIG. 1B is a schematic cross-sectional view illustrating a power module according to a first embodiment of the present disclosure. In the embodiment, the carrier board 410 of the power module 1 includes a main body 101, at least two metal-wiring layers (for example a first metal-wiring layer 431 and a second metal-wiring layer 432) and at least one metal block (for example a first metal block 421, a second metal block 422 and a third metal block 423). The main body 101 includes at least two terminals, an upper surface 102 and a lower surface 103. Preferably but not exclusively, the at least two terminals are selected from the at least two of a positive terminal TP, a negative terminal TN and an output terminal TO, which are all disposed on the upper surface 102. The first metal-wiring layer 431 and the second metal-wiring layer 432 are disposed within the main body 101 to form at least two parts of metal traces, which are connected to the at least two of the positive terminal TP, the negative terminal TN and the output terminal TO, respectively. In the embodiment, any one of the first metal block 421, the second metal block 422 and the third metal block 423 is embedded in the main body 101, spatially corresponds to and is connected to one of the positive terminal TP, the negative terminal TN and the output terminal TO. In other embodiments, two of the positive terminal TP, the negative terminal TN and the output terminal TO are omitted, and only one metal block is embedded in the main body 101. In addition, the power module 1 using the same carrier board 410 includes a first switch 451 and a second switch 452 disposed on the upper surface 102 of the carrier board 410. In the embodiment, the first switch 451 and the second switch 452 are connected in series through the positive terminal TP, the negative terminal TN and the output terminal TO to form a bridge arm.

Figure 2A:
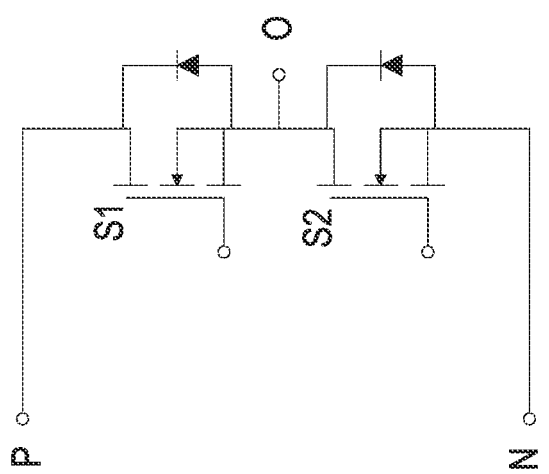
FIG. 2A is a circuit diagram showing a half-bridge power module of the present disclosure.
Figure 2B:
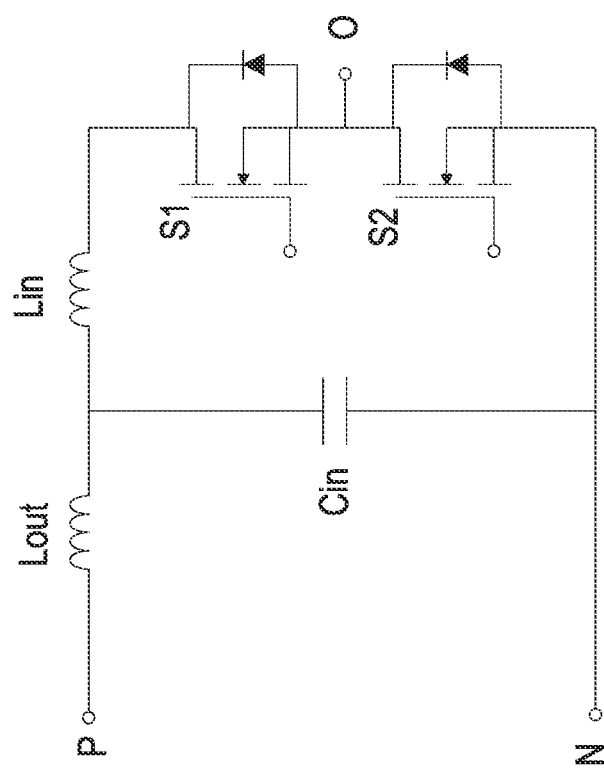
FIG. 2B is an equivalent circuit diagram showing the power module of the present disclosure.

FIG. 2A is a circuit diagram showing a half-bridge power module of the present disclosure. FIG. 2B is an equivalent circuit diagram showing the power module of the present disclosure. Please refer to FIGS. 1A to 2B. In the embodiment, as shown in FIG. 2A, the bridge arm is formed by connecting the first switch 451 and the second switch 452 in series through the positive terminal TP, the negative terminal TN and the output terminal TO. In the related art, as shown in the circuit diagram of the half-bridge power module shown in FIG. 2A, the half-bridge arm includes a first switch 451 and a second switch 452. The first switch 451 and the second switch 452 are connected in series between the positive terminal TP and the negative terminal TN. Moreover, the output terminal TO is electrically connected to a common node of the first switch 451 and the second switch 452. In other words, the P electrode is connected to the first switch 451, such as a pad of the switch S1. The N electrode is connected to the second switch 452, such as a pad of the switch S2. The first switch 451 and the second switch 452 are connected to each other and are connected to the O electrode.

Moreover, in the embodiment, the power module 1 is for example but not limited to an embedded power module. Preferably but not exclusively, the power module 1 further includes a clamping component 440, such as a capacitor. As shown in FIG. 2B, it illustrates an equivalent circuit diagram of a power module with a clamping capacitor. When a clamping capacitor is disposed within the power module 1, and the first switch 451 and the second switch 452 are turned off, the surrounding area of the corresponding high-frequency loop will be reduced and the loop parasitic inductance will also be reduced. If there is no clamping capacitor disposed within the power module 1, the value of the loop parasitic inductance is Lout+Lin. As the clamping capacitor Cin is disposed within the power module 1, the value of the loop parasitic inductance becomes Lin. Therefore, by disposing the clamping capacitor Cin into the loop, the parasitic inductance can be reduced.

Figure 3:
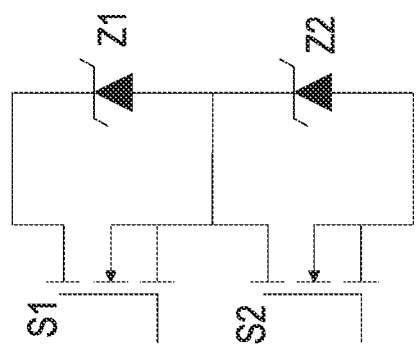
FIG. 3 is a circuit diagram showing a half-bridge power module having a clamping circuit of the present disclosure.

FIG. 3 is a circuit diagram of a power module with another clamping circuit. In the embodiment, two Zener diodes Z1 and Z2 are connected in parallel with the first switch S1 and the second switch S2, respectively, and then connected in series. The clamping circuit formed by the series connection of two Zener diodes can play the role of voltage division.

Figure 4:
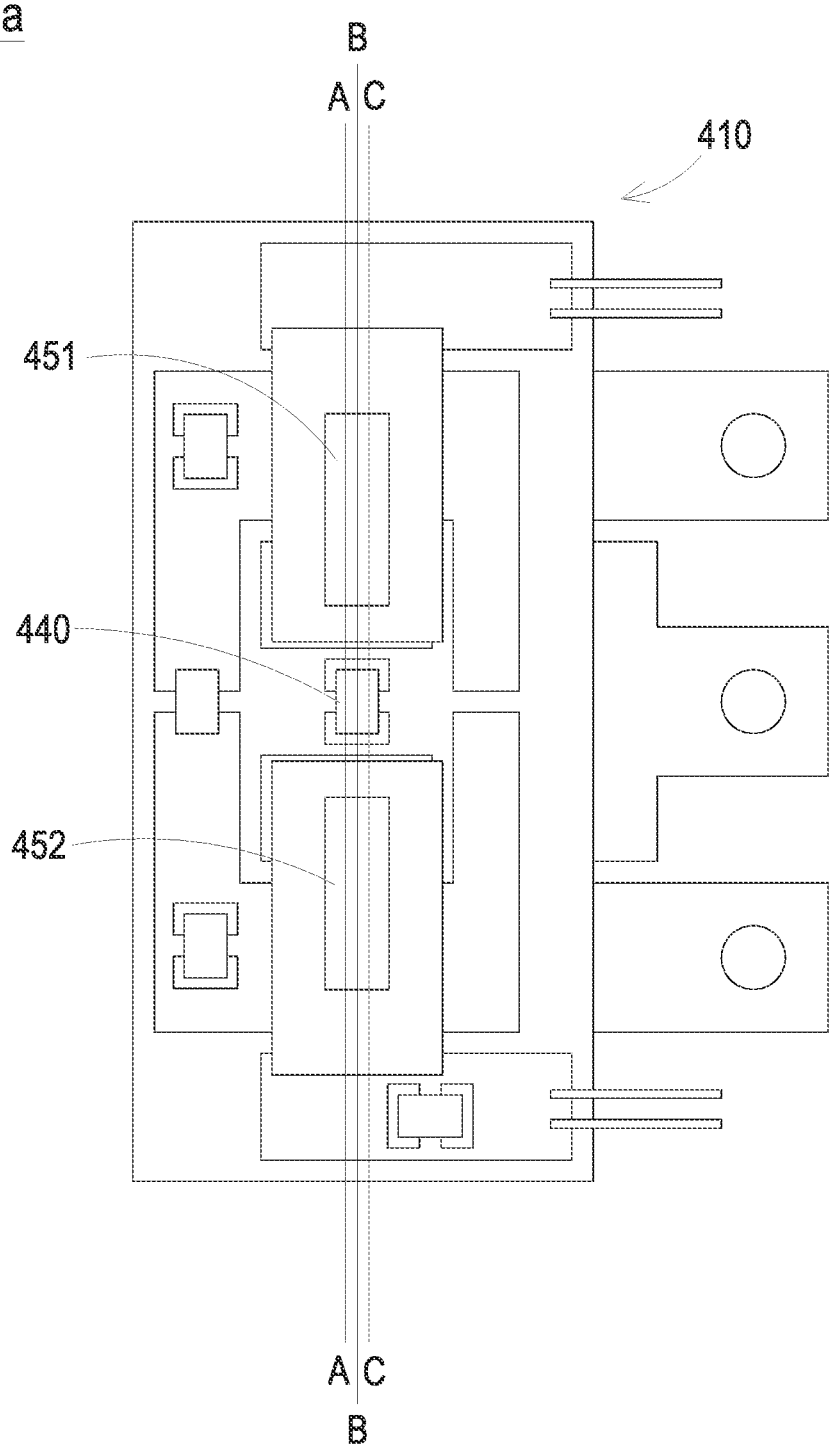
FIG. 4 is a top view illustrating a power module according to a second embodiment of the present disclosure.
Figure 5:
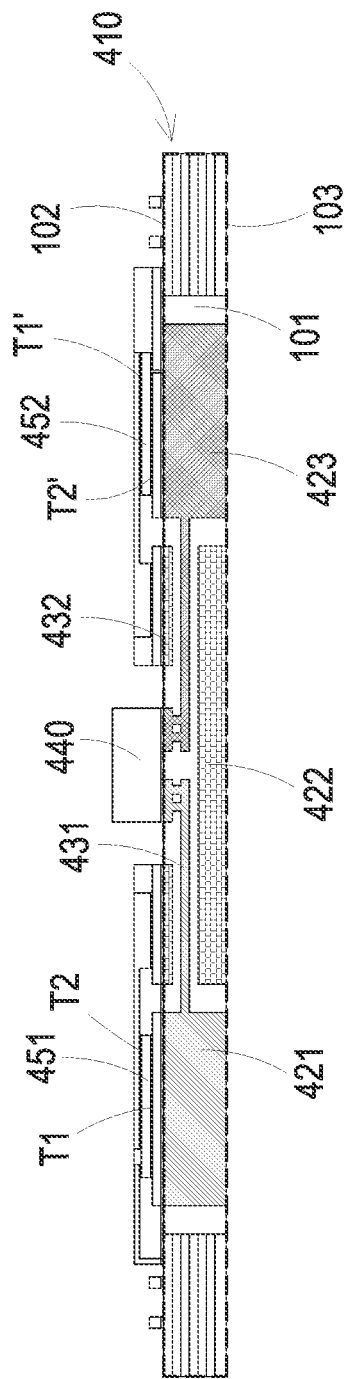
FIG. 5 is a schematic cross-sectional view illustrating the power module of FIG. 4 and taken along the line A-A.
Figure 6:
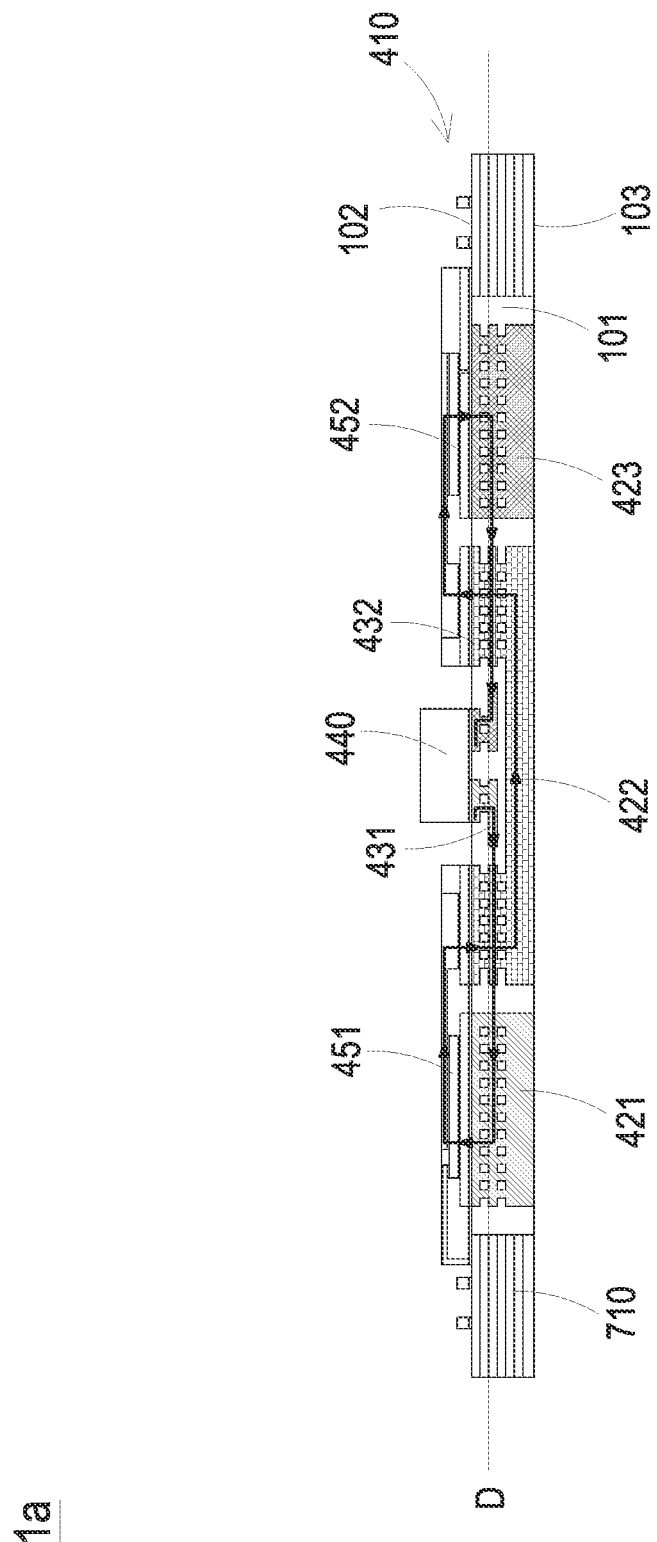
FIG. 6 is a schematic cross-sectional view illustrating the power module of FIG. 4 and taken along the line C-C.
Figure 7:
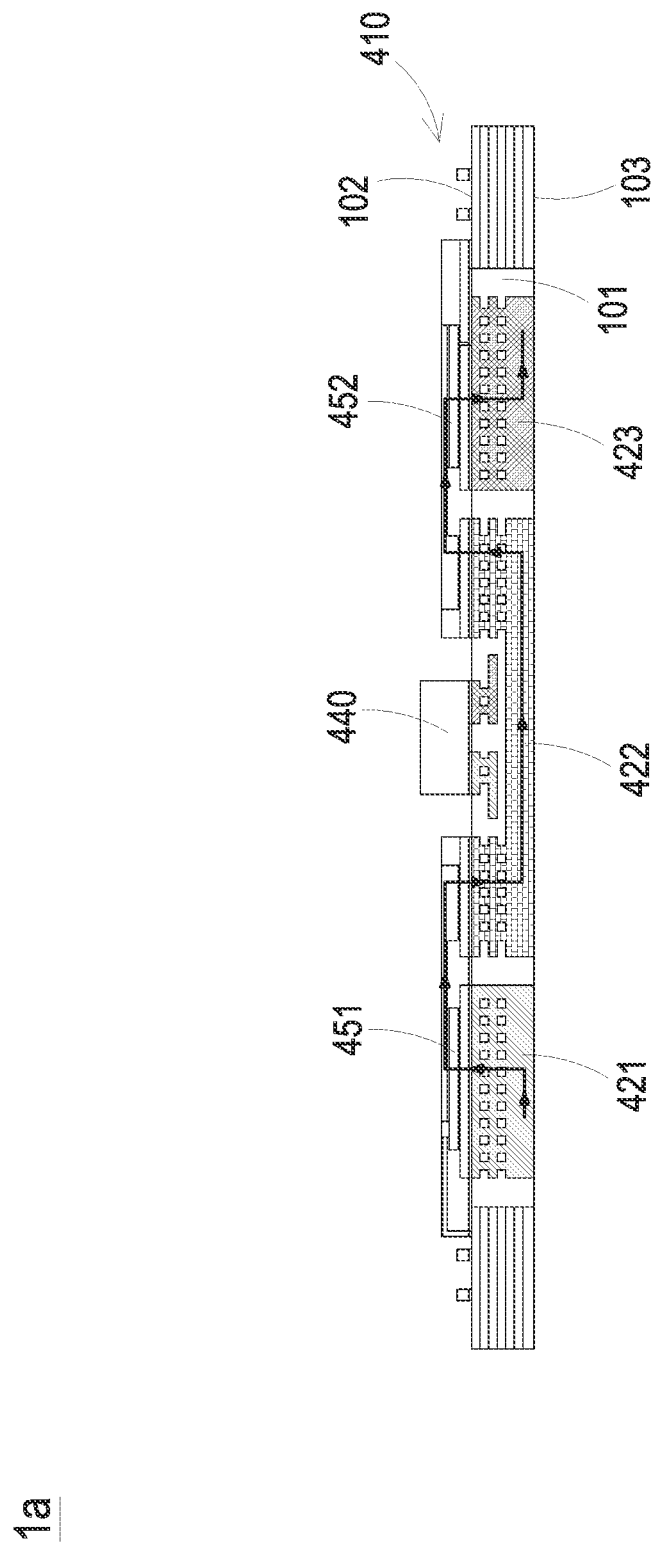
FIG. 7 is a schematic cross-sectional view illustrating the power module of FIG. 4 and taken along the line B-B.
Figure 8:
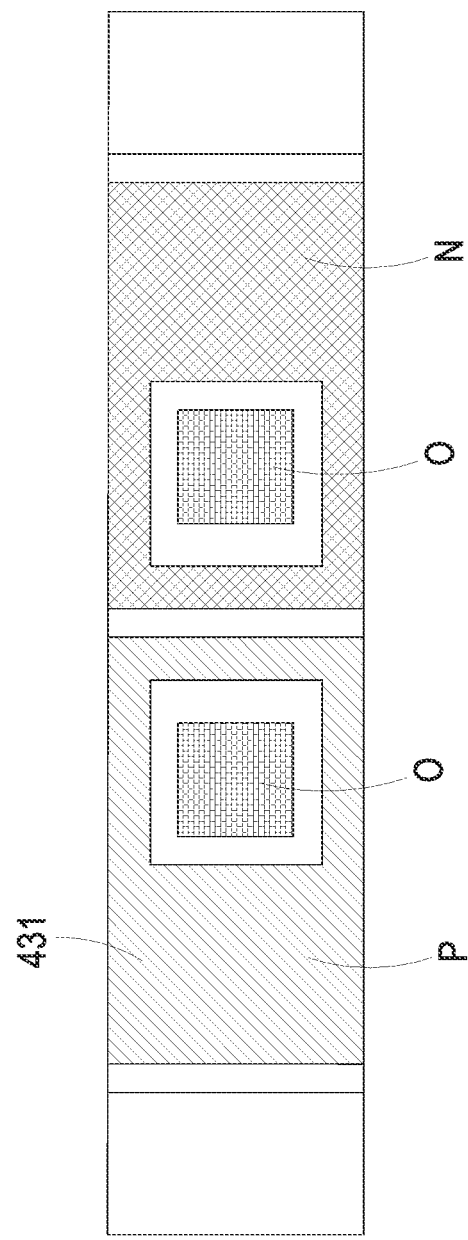
FIG. 8 is a partial cross-sectional view illustrating the power module of FIG. 6 and taken along the line D-D.
Figure 9:
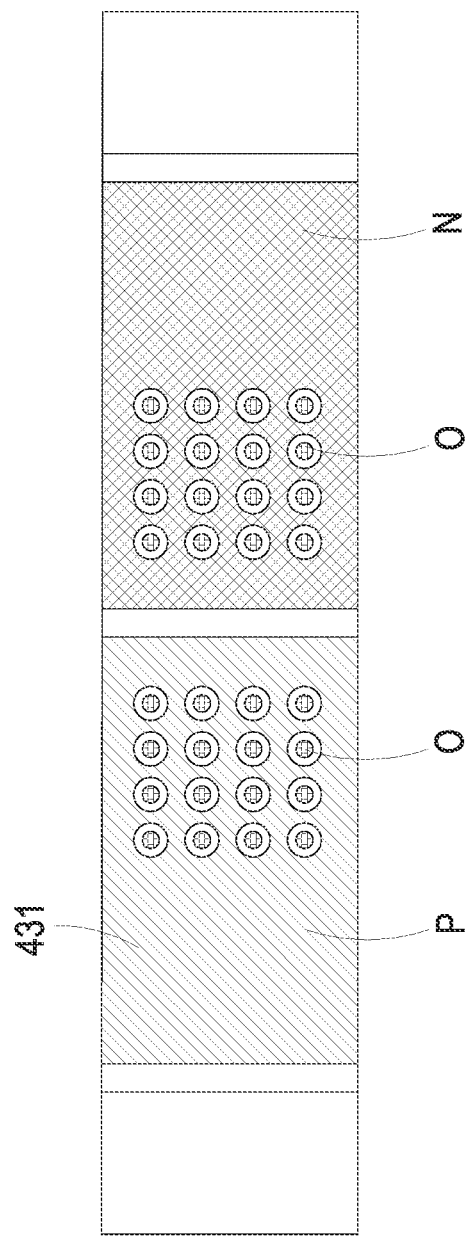
FIG. 9 is another partial cross-sectional view illustrating the power module of FIG. 6 and taken along the line D-D.

FIG. 4 is a top view illustrating a power module according to a second embodiment of the present disclosure. FIG. 5 is a schematic cross-sectional view illustrating the power module of FIG. 4 and taken along the line A-A. FIG. 6 is a schematic cross-sectional view illustrating the power module of FIG. 4 and taken along the line C-C. FIG. 7 is a schematic cross-sectional view illustrating the power module of FIG. 4 and taken along the line B-B. FIG. 8 is a partial cross-sectional view illustrating the power module of FIG. 6 and taken along the line D-D. FIG. 9 is another partial cross-sectional view illustrating the power module of FIG. 6 and taken along the line D-D. In the embodiment, the structures, elements and functions of the power module 1a are similar to those of the power module 1 of FIG. 2, and are not redundantly described herein. In the embodiment, the power module 1a includes a carrier board 410, a first switch 451, a second switch 452 and a clamping component 440. The carrier board 410 is shown in a bold dashed frame as shown in FIG. 5. The first switch 451 and the second switch 452 correspond to the first switch S1 and the second switch S2 in FIG. 2B, respectively. Preferably but not exclusive, the first switch 451 and the second switch 452 are MOSFET, IGBT, BJT or other types of switches. The present disclosure is not limited thereto. The carrier board 410 includes a first metal block 421, a second metal block 422, a third metal block 423, a first metal-wiring layer 431 and a second metal-wiring layer 432. The second metal block 422 is located between the first metal block 421 and the third metal block 423. The main body 101 of the carrier board 410 includes an upper surface 102 and a lower surface 13. The clamping component 440 is disposed on the upper surface 102 of the carrier board 410. The first metal-wiring layer 431 and the second metal-wiring layer 432 are located at a side of the first metal block 421, the second metal block 422 and the third metal block 423, which is the same side of the at least one metal block facing the upper surface 102. In the embodiment, the first metal-wiring layer 431 and the second metal-wiring layer 432 are located between the clamping component 440 and the second metal block 422. The first switch 451 and the second switch 452 are disposed on the upper surface 102 of the carrier board 410. The first switch 451 and the second switch 452 are connected to the clamping component 440 through the first metal-wiring layer 431 and the second metal-wiring layer 432. The first switch 451 includes a first pad T1 and a second pad T2. The second switch 452 includes a first pad T1' and a second pad T2'. Taking MOSFET as an example, the first pad s T1, T1' represent the drain, the second pad pad s T2, T2' represent the source, and the third pad s (not shown) represent the gate. In other embodiments, the first switch 451 and the second switch 452 are for example but not limited to two-terminal devices, such as diodes. The present disclosure is not limited thereto. In the embodiment, the first pad T1 of the first switch 451 is connected to the first metal block 421. The second pad T2 of the first switch 451 is connected to the second metal block 422 through the second metal-wiring layer 432. The first pad T1' of the second switch 452 is connected to the second metal block 422 through the second metal-wiring layer 432. The second pad T2' of the second switch 452 is connected to the third metal block 423. In the embodiment, a projection of the first switch 451 on the lower surface 103 of the carrier board 410 is at least partially overlapped with a projection of the first metal block 421 or the second metal block 422 on the lower surface 103 of the carrier board 410. Moreover, a projection of the second switch 452 on the lower surface 103 of the carrier board 410 is at least partially overlapped with a projection of the second metal block 422 or the third metal block 423 on the lower surface 103 of the carrier board 410.

In the embodiment, FIG. 6 and FIG. 7 indicate a clamp-circuit loop and the main-power loop formed by the power module 1a, respectively. Please refer to FIGS. 5 and 6. The current of the clamp-circuit loop flows through the first metal block 421, the first switch 451, the second metal block 422, the second switch 452, the third metal block 423, the clamping component 440 and the first metal-wiring layer 431. As shown in FIG. 6, the high-frequency current flowing through the first metal-wiring layer 431 and the high-frequency current flowing through the first switch 451, the second switch 452 and the second metal block 422 have opposite directions and are equal in magnitude. The clamp-circuit loop is also defined as high frequency loop. Moreover, the area of the high frequency loop is affected by the distance between the first metal-wiring layer 431 and the first pads T1, T1' or the second pads T2, T2' of the two switches, and the distance between the first metal-wiring layer 431 and the second metal block 422. Under the printed circuit board technology used, the above distances are about 100 μm. In that, the area of the high-frequency loop in the cross section is reduced greatly. Therefore, with the structure shown in the embodiment, in the cross-sectional direction, the area of the high-frequency loop is small, and the corresponding loop parasitic inductance is very small. Preferably but not exclusively, the loop inductance is less than or equal to 1.4 nH when the loop inductance is calculated at a frequency greater than 1 MHz.

Moreover, please refer to FIGS. 5 and 7. In the embodiment, the current of the main-power loop flows from the first metal block 421 into the first pad T1 of the first switch 451, further from the second pad T2 of the first switch 451 into the second metal block 422, then from the second metal block 422 into the first pad T1' of the second switch 452, and finally from the second pad T2' of the second switch 452 into the third metal block 423. In the embodiment, the current of the main-power loop crosses through the first metal-wiring layer 431, and the part of the current flowing through the first metal-wiring layer 431 in the horizontal direction can be ignored. Therefore, the current of the main-power loop and the current of the clamp-circuit loop are at least partially decoupled in the flowing paths, and the mutual influence is eliminated. Because of the separation of the clamp-circuit loop and the main-power loop, the current of the main-power loop is not transmitted through the first metal-wiring layer 431. Therefore, the first metal-wiring layer 431 can be thinner. Preferably but not exclusively, the thickness of the first metal-wiring layer 431 is less than 70 μm. With the thinner wiring layer, it is beneficial for reducing the manufacturing cost and the thickness of the carrier board 410. Furthermore, the filling of the insulation-material layer of the package body is improved, and the reliability of the product is enhanced. In addition, with such structure, the current path of the main-power loop is very smooth, and the length of the current path is greatly reduced so as to reduce the impedance of the current path. Consequently, the loss of the current path is reduced.

In the embodiment, the cross sectional view in FIG. 6 shows the clamp-circuit loop and the cross sectional view in FIG. 7 shows the main-power loop. The structures of the two cross sectional views are staggered in the direction perpendicular to the paper surface, and the staggering number can be one or more. The occurrence numbers of the two cross-section structures need not be equal. That is, the first metal-wiring layer 431 located between the first switch 451 and the clamping component 440 is used to construct a high-frequency-circuit loop and the main-power-circuit loop, respectively. Similarly, the first metal-wiring layer 431 located between the second switch 452 and the clamping component 440 is also used to construct a high-frequency-current loop and the main-power loop, respectively. In addition, it should be particularly noted that the metal connecting component on the side of the first switch 451 and the second switch 452 away from the carrier board 410 can be smaller than or beyond the range of the chip in the direction perpendicular to the paper surface. That is, the chips of the first switch 451 and the second switch 452 and the connecting metal on the side away from the carrier board 410 need not be present in a cross-sectional view at the same time. It will not be redundantly described hereafter. FIGS. 8 and 9 are two different partial cross-sectional views illustrating the power module of FIG. 6 and taken along the line D-D. In FIG. 8, the region of the first metal-wiring layer 431 connected to the second pad T2 of the first switch 451 and the second metal block 422 is designed as an integral part, and the region of the first metal-wiring layer 431 connected to the first pad T1' of the second switch 452 and the second metal block 422 is designed as an integral part. Moreover, in FIG. 9, the region of the first metal-wiring layer 431 connected to the second pad T2 of the first switch 451 and the second metal block 422, and the region of the first metal-wiring layer 431 connected to the first pad T1' of the second switch 452 and the second metal block 422 are realized by holes and wiring.

In the embodiment, the first switch 451 and the second switch 452 are disposed above the first metal block 421 and the third metal block 423, respectively. The first metal block 421 and the third metal block 423 are separated from each other, and it is helpful for improving the thermal interaction between the first switch 451 and the second switch 452 effectively, thereby improving the heat dissipation of the first switch 451 and the second switch 452. The large-area metal overlapped with the projection of the first switch 451 and the second switch 452 on the lower surface 103 of the carrier board 410 is used not only for current flowing but also for heat dissipation. It is helpful for reducing the thermal resistance of the carrier board 410 from the first switch 451 and the second switch 452 toward the lower surface 103. Preferably but not exclusively, the copper is used for the metal block. Since the volumetric specific heat capacity of copper is larger, the ability of the first switch 451 and the second switch 452 to resist instantaneous large current can be improved.

Figure 39A:
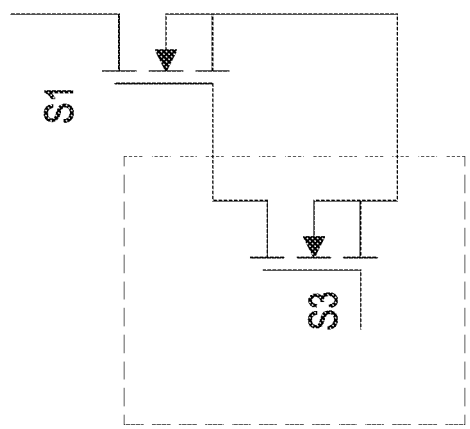
FIG. 39A shows a first example of a driving clamping circuit of the present disclosure.
Figure 39B:
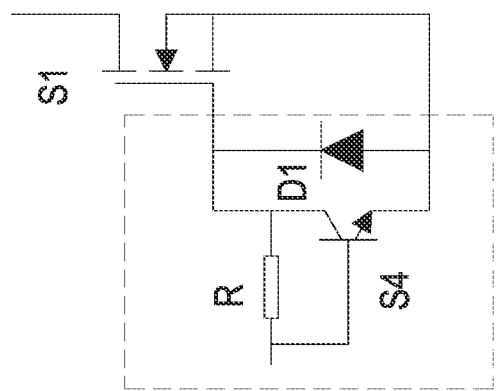
FIG. 39B shows a second example of a driving clamping circuit of the present disclosure.
Figure 39C:
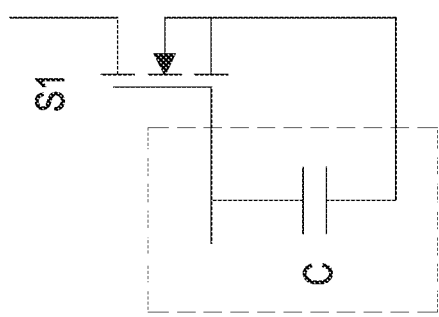
FIG. 39C shows a third example of a driving clamping circuit of the present disclosure.

In addition, the carrier board 410 of the power module 1a includes the first metal-wiring layer 431 and the second metal-wiring layer 432. When the carrier board 410 is further equipped with a driving clamp circuit to meet stricter requirements, the driving clamp circuit can be overlapped with the first metal-wiring layer 431 and the second metal-wiring layer 432, and the current directions of the loop are reversed in the first metal-wiring layer 431 and the second metal-wiring layer 432, so as to reduce the loop inductance effectively. The driving clamp circuit can be for example but not limited to a circuit shown in the dashed frame in FIG. 39A, FIG. 39B, or FIG. 39C. Taking FIG. 39A as an example, the switch S1 is the first switch S1 in the aforementioned power module, and the device S3 in the dashed frame is connected to the gate and source of the switch S1. The device S3 is a part of driving circuit for the switch S1. More specifically, the device S3 can be used to clamp the voltage between the gate and source of the switch S1. The difference between the circuits shown in FIG. 39B and FIG. 39A is that the driving clamp circuit has changed. The driving clamp circuit includes a resistor R, a bipolar transistor S4 and a diode D1. FIG. 39C provides another variation. The driving clamp circuit can be a capacitor C connecting the gate and source of the switch S1. The driving circuit or the driving clamp circuit of any switch on the carrier board 410 of the power module 1a can be connected through at least two metal-wiring layers located at the same side of the metal block. Part of the first metal-wiring layer 431 and the second metal-wiring layer 432 are used for the traces of the loop. The projections of the traces of the loop on the lower surface 103 of the carrier board 410 are almost overlapped. It is helpful for reducing the loop parasitic inductance greatly and achieving a good clamping effect.

In the embodiment, a multilayer wiring region 710 is further disposed out of the first metal block 421 and the third metal block 423 to further integrate more functions, such as a driving circuit and a control circuit. Preferably but not exclusively, the multilayer wiring region 710 is a prefabricated multilayer printed circuit board. A plurality of prefabricated metal conductors are arranged in the opening windows of the printed circuit board, and then the carrier board is formed by a lamination process for the printed circuit board. Thus, the technical solution is not only suitable for integrated power devices, but also suitable for the system-level integration. In addition, the carrier board 410 of the present disclosure is produced by a printed circuit board manufacturing process, and it is suitable for mass production, and has the advantages of fast delivery and low cost. In addition, the devices disposed on the carrier board 410 can be realized by discrete devices, which are manufactured with a large scale easily and can be tested individually, thereby further improving the manufacturability and cost of the product.

Figure 10A:
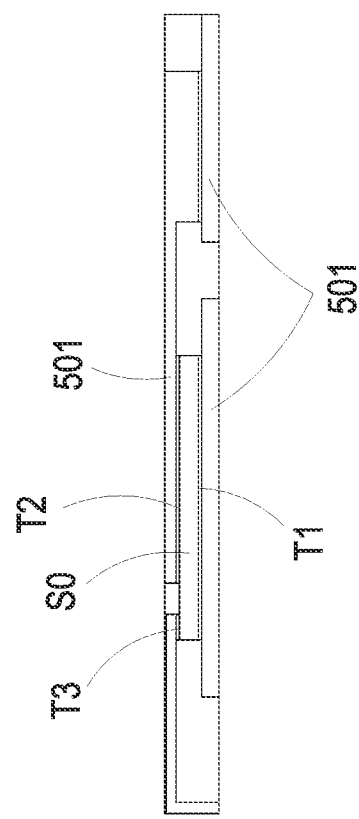
FIG. 10A is a schematic cross-sectional view illustrating a first example of the switch of the present disclosure.
Figure 10B:
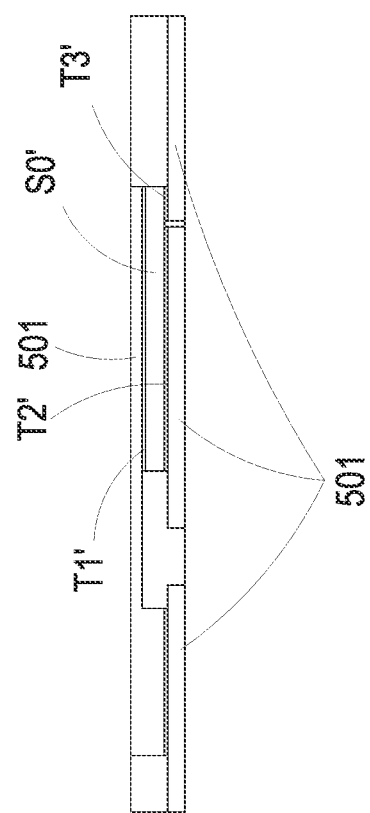
FIG. 10B is a schematic cross-sectional view illustrating a second example of the switch of the present disclosure.

In the embodiment, the first switch 451 and the second switch 452 are for example but not limited to packaged devices. For example, FIGS. 10A and 10B are schematic cross-sectional views illustrating different examples of the switch in the present disclosure. In the embodiment, for example, the switches for the first switch 451 and the second switch 452 are packaged and led out through three electrodes. The three electrodes of the packaged switch are led out in the same plane or different planes through the metal connectors 501. Preferably but not exclusively, the metal connectors 501 of the switch are completely exposed on the surface of the packaged switch. Certainly, the side of the switch without the electrode is covered by the insulating material. FIG. 10A shows a package form of a discrete power device. Preferably but not exclusively, the switch S0 is a MOSFET, and includes a first pad T1 representing the drain, a second pad T2 representing the source, and a third pad T3 representing the gate. For a vertical device, the second terminal T2 representing the source and the third pad T3 representing the gate are usually arranged on one side of the bare chip, and the first pad T1 representing the drain is arranged on the opposite side. The lead-out surfaces of the switches in FIG. 10A and FIG. 10B are both lower surfaces. The first pad T1 of the switch S0 in FIG. 10A is disposed on the metal connector 501 on the lower surface. The second pad T2 is connected to the metal connector 501 on the upper surface through solder, sintered material or conductive paste, and is led to the metal conductor 501 on the lower surface through the metal conductor 501 on the upper surface to realize electrode lead-out. The third pad T3 is led out to the lower surface through the metal conductor 501 on the upper surface of the switch S0 and coplanar with the metal connector 501 on the lower surface. The electrode lead-out is achieved. In another embodiment, the pad is led out by bonding wires. The second pad T2' and the third pad T3' of the switch S0' in FIG. 10B are disposed on the metal connector 501 on the lower surface, and the first pad T1' is connected to the metal connector 501 on the upper surface through solder, sintered material or conductive paste, and is led to the metal conductor 501 on the lower surface through the metal conductor 501 on the upper surface to realize electrode lead-out. The present disclosure is not limited thereto. In other embodiments, DirectFET, CanPAK, the embedded package, PowerPAK, SOT263 and other SOT series are applicable for packaging. In order to further improve the switching characteristics of the device, the Kelvin connection method can be adopted for the control electrode. Certainly, the present disclosure is not limited thereto. Furthermore, two or more switches connected in parallel can be packaged in the same structure.

On the other hand, in the embodiment, the thicknesses of the first metal block 421, the second metal block 422 and the third metal block 423 are greater than or equal to 0.3 mm. In an embodiment, the thicknesses of the first metal block 421, the second metal block 422 and the third metal block 423 are less than 0.3 mm. In the embodiment, a thickness of the at least two parts of metal traces formed by the first metal-wiring layer 431 and the second metal-wiring layer 432 is less than a thickness of the at least one of the first metal block 421, the second metal block 422 and the third metal block 423. When the thicknesses of the first metal block 421, the second metal block 422 and the third metal block 423 are greater than or equal to 0.3 mm, the metal block not only provides good electrical and thermal conductivity, but also provides good structural support. Compared with the traditional method of using multi-layer printed circuit boards to handle high frequency circuits and external bus bars to handle power circuits, it saves a lot of installation and connection parts and avoids the possibility of multiple insulating media in the vertical path of the device by utilizing the metal block of the present disclosure. Moreover, it further improves the heat dissipation performance of power device.

Figure 11:
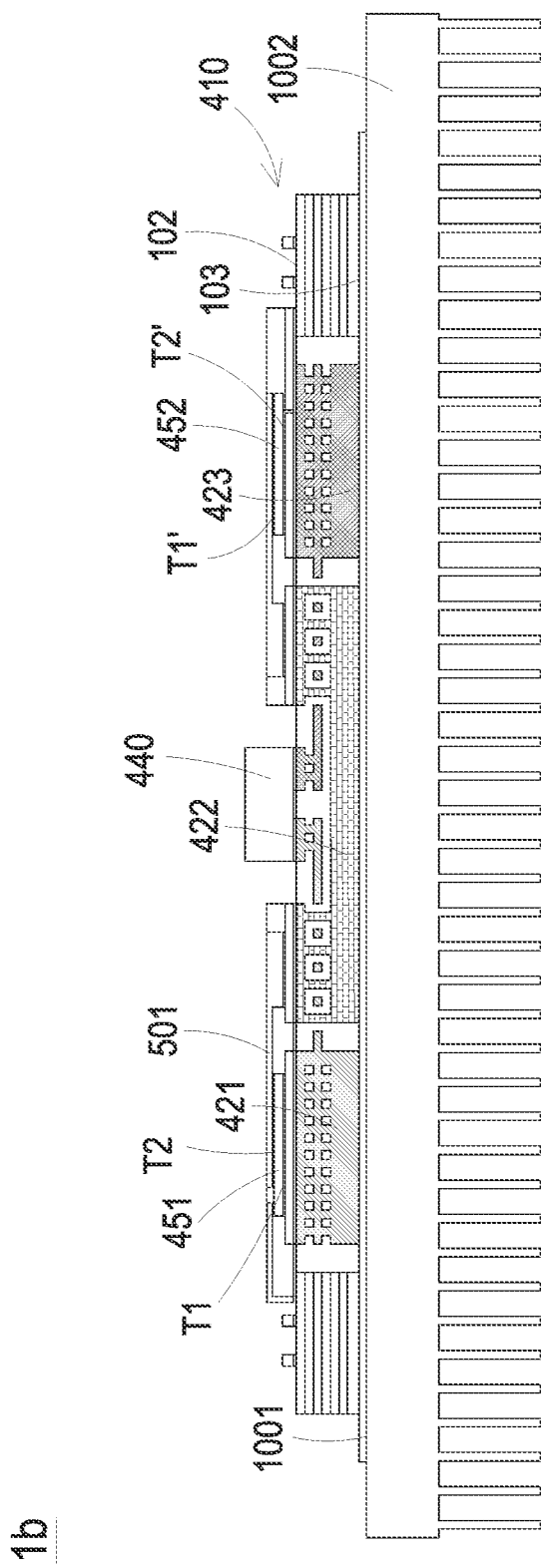
FIG. 11 is a schematic cross-sectional view illustrating a power module with a heat dissipation device according to a third embodiment of the present disclosure.

FIG. 11 is a schematic cross-sectional view illustrating a power module with a heat dissipation device according to a third embodiment of the present disclosure. In the embodiment, the structures, elements and functions of the power module 1b are similar to those of the power module 1a of FIG. 5, and are not redundantly described herein. In the embodiment, the power module 1b further includes a first heat dissipation device 1002 and a first thermal-conductive and insulating material 1001. The first heat dissipation device 1002 and the first thermal-conductive and insulating material 1001 are disposed on the lower surface 103 of the carrier board 410. The first metal block 421, the second metal block 422, and the third metal block 423 are connected to the first heat dissipation device 1002 through the first thermal-conductive and insulating material 1001. As shown in FIG. 11, the first metal block 421, the second metal block 422, and the third metal block 423 are connected to the first heat dissipation device 1002 through the first thermal-conductive and insulating material 1001 for heat dissipation. In the embodiment, the first heat dissipation device 1002 is for example but not limited to a fin-type heat sink. In other embodiments, the first heat dissipation device 1002 is a heat-dissipation-column-type heat sink or a water-cooling heat sink. In the embodiment, the heat generated from the first switch 451 and the second switch 452 is dissipated through the heat dissipation paths in two directions. Taking the first switch 451 as an example, the heat dissipation paths include a first path transferred from the switch through the first metal block 421, and a second path transferred from the switch through the metal connector 501 connected to the second pad T2 of the first switch 451 to the second metal block 422. Generally, the thermal resistance of the metal connector 501 connected to the second terminal T2 of the first switch 451 is larger than that of the first metal block 421 or the second metal block 422 due to the small cross-sectional size of the heat dissipation path. Therefore, the thermal resistance of the first path is smaller than that of the second path. Generally, the thermal resistance of the first path is about half of the thermal resistance of the second path, or even smaller. Therefore, the first path is the main heat dissipation path. Similarly, the main heat dissipation path of the second switch 452 is a path transferred through the third metal block 423.

Notably, in the embodiment, the first metal block 421 and the third metal block 423 are located in the main heat dissipation paths. Namely, the first metal block 421 and the third metal block 423 play the role of providing not only a path for current in the circuit, but also the main heat dissipation paths in the structure of the power module 1b. For example, in order to achieve a better heat dissipation effect, the width of the metal block overlapping with the first switch 451 or the second switch 452 on the lower surface 103 of the carrier 410 is relatively wide. In the embodiment, the widths of the first metal block 421, the second metal block 422 and the third metal block 423 are different, so as to reduce the thermal resistance on the main heat dissipation paths. For example, the first metal block 421 and the third metal block 423 have the same width and are wider than the second metal block 422. Certainly, the present disclosure is not limited thereto. In an embodiment, the widths of the first metal block 421, the second metal block 422 and the third metal block 423 are the same. In other embodiments, the widths of the first metal block 421, the second metal block 422 and the third metal block 423 are completely different.

It should be noted that the power module 1b further includes a thermal-conductive and insulating layer, which is disposed on the lower surface 103 of the carrier board 410 to perform the function of thermally conductive and insulating. Certainly, the present disclosure is not limited thereto.

Figure 12:
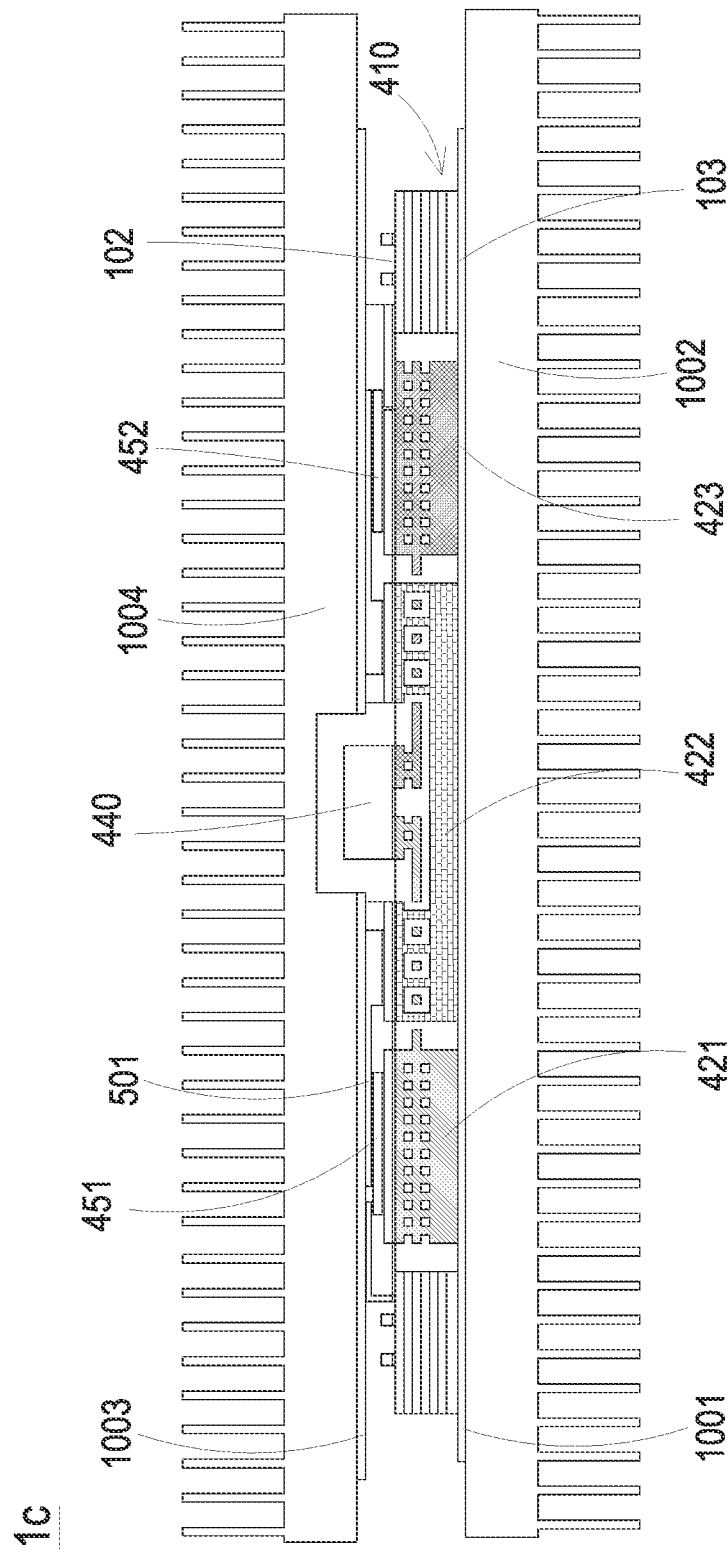
FIG. 12 is a schematic cross-sectional view illustrating a power module with a heat dissipation device according to a fourth embodiment of the present disclosure.

FIG. 12 is a schematic cross-sectional view illustrating a power module with a heat dissipation device according to a fourth embodiment of the present disclosure. In the embodiment, the structures, elements and functions of the power module 1c are similar to those of the power module 1a of FIG. 5, and are not redundantly described herein. In the embodiment, the power module 1c further includes a second heat dissipation device 1004 and a second thermal-conductive and insulating material 1003. The second heat dissipation device 1004 and the second thermal-conductive and insulating material 1003 are disposed over the first switch 451 and the second switch 452. The first switch 451 and the second switch 452 are connected to the second heat dissipation device 1004 through the second thermal-conductive and insulating material 1003. Preferably but not exclusively, in the embodiment, the metal connector 501 above the first switch 451 is also connected to the heat sink through a high thermal-conductive and insulating material, so that a double-sided heat dissipation is achieved. In the power module 1b of FIG. 11 and the power module 1c of FIG. 12, each thermal-conductive and insulating material is an organic material, such as a high thermal-conductive and insulating film, or a ceramic material. In addition, the thermal-conductive and insulating material is not limited to a single-layer material. Preferably but not exclusively, the thermal-conductive and insulating material is a composite layer material, such as a ceramic having one side/two sides composite organic layer, or a high-insulation organic film having one side/two sides composite high thermal-conductive layer.

Figure 13:
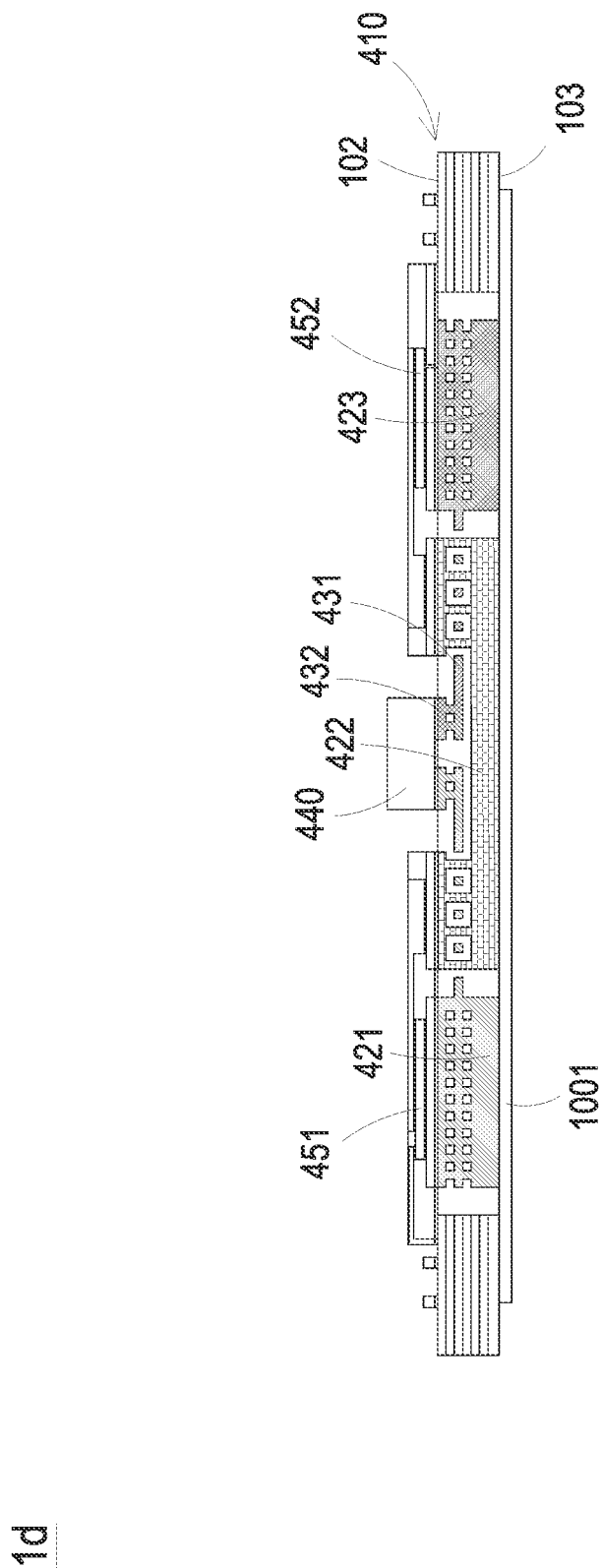
FIG. 13 is a schematic cross-sectional view illustrating a power module according to a fifth embodiment of the present disclosure.

FIG. 13 is a schematic cross-sectional view illustrating a power module with a heat dissipation device according to a fifth embodiment of the present disclosure. In the embodiment, the structures, elements and functions of the power module 1d are similar to those of the power module 1a of FIG. 5, and are not redundantly described herein. In the embodiment, the power module 1d further includes a first thermal-conductive and insulating material 1001. In the embodiment, the first thermal-conductive and insulating material 1001 is disposed under the first metal block 421, the second metal block 422 and the third metal block 423. By prefabricating the first thermal-conductive and insulating material 1001, the power module 1d is more convenient to use.

Figure 14:
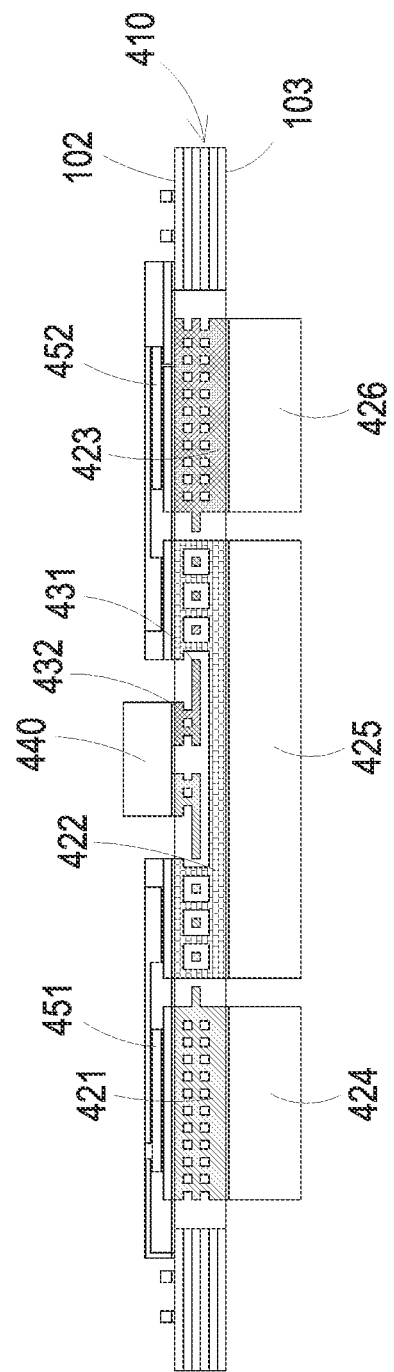
FIG. 14 is a schematic cross-sectional view illustrating a power module according to a sixth embodiment of the present disclosure.

FIG. 14 is a schematic cross-sectional view illustrating a power module with a heat dissipation device according to a sixth embodiment of the present disclosure. In the embodiment, the structures, elements and functions of the power module 1e are similar to those of the power module 1a of FIG. 5, and are not redundantly described herein. In the embodiment, the first metal block 421, the second metal block 422 and the third metal block 423 are formed by the thin metal layers having thickness of less than 0.3 mm. The carrier board 410 can be manufactured by a printed circuit board technology to reduce cost.

Moreover, in order to improve the heat dissipation capability of the switch in the downward direction, in the embodiment, the power module 1e includes a fourth metal block 424, a fifth metal block 425 and a sixth metal block 426 disposed on the lower surface 103 of the carrier board 410. In the embodiment, the bottoms of the first metal block 421, the second metal block 422, and the third metal block 423 are further connected to the fourth metal block 424, the fifth metal block 425 and the sixth metal block 426, respectively, which are thinner and have a thickness greater than or equal to 0.3 mm. The connection method is realized by welding or sintering. Certainly, the present disclosure is not limited thereto.

Figure 15:
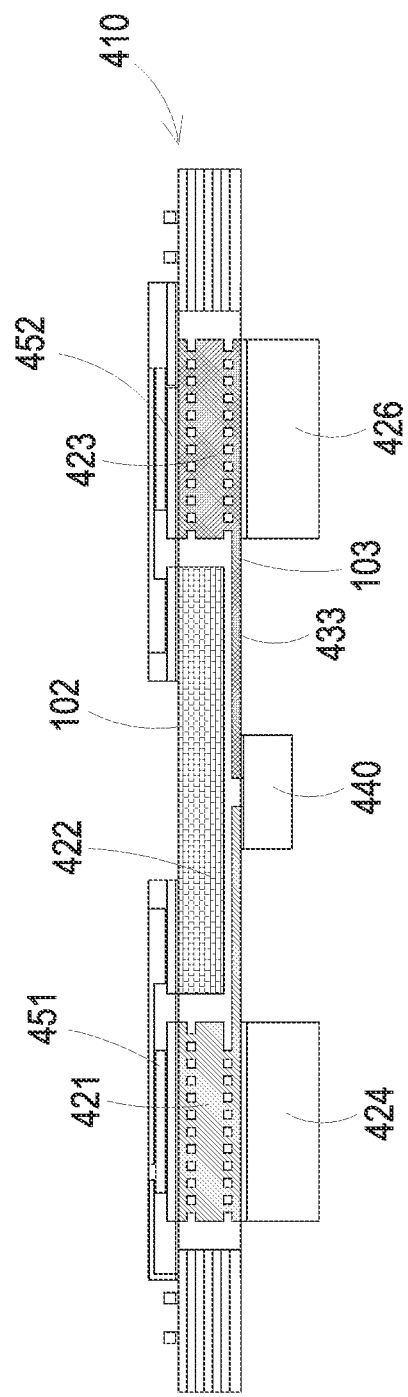
FIG. 15 is a schematic cross-sectional view illustrating a power module according to a seventh embodiment of the present disclosure.

FIG. 15 is a schematic cross-sectional view illustrating a power module with a heat dissipation device according to a seventh embodiment of the present disclosure. In the embodiment, the structures, elements and functions of the power module 1f are similar to those of the power module 1a of FIG. 5, and are not redundantly described herein. In the embodiment, the first switch 451, the second switch 452 and the clamping component 440 are disposed on two sides of the carrier board 410 of the power module 1f. In the embodiment, the projection of the clamping component 440 on the lower surface 103 of the carrier board 410 is between the projections of the first switch 451 and the second switch 452 on the lower surface 103 of the carrier board 410. A third metal-wiring layer 433 is disposed between the clamping component 440 and the second metal block 422. One terminal of the clamping component 440 is connected to the first metal block 421 through the third metal-wiring layer 433, and another terminal of the clamping component 440 is connected to the third metal block 423 through the third metal-wiring layer 433. In the embodiment, the bottoms of the first metal block 421, the second metal block 422, and the third metal block 423 are further connected to the fourth metal block 424 and the sixth metal block 426, respectively, which are thinner and have a thickness greater than or equal to 0.3 mm. The connection method is realized by welding or sintering. In that, the heat dissipation capability of the first switch 451 and the second switch 452 in the downward direction is improved.

Figure 16:
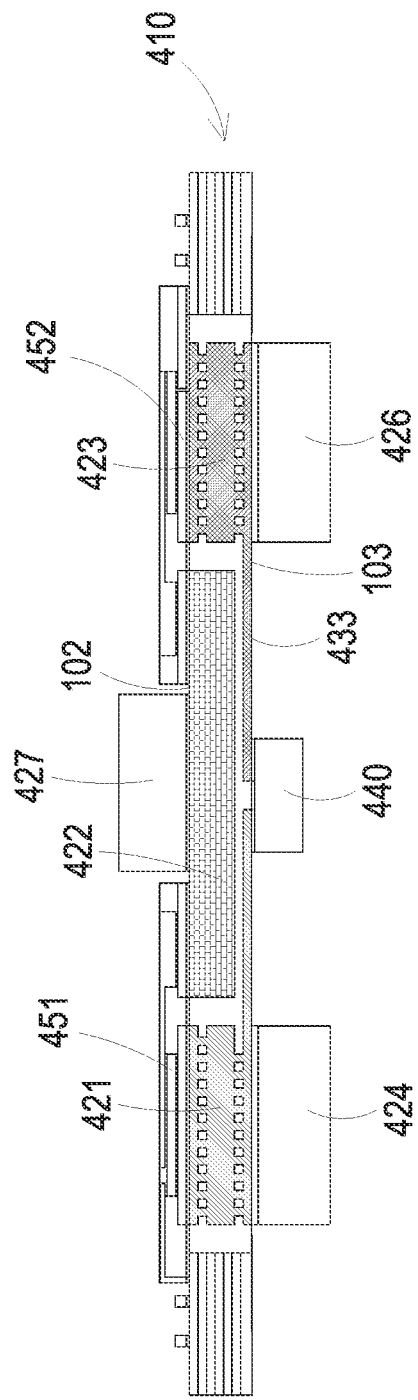
FIG. 16 is a schematic cross-sectional view illustrating a power module according to an eighth embodiment of the present disclosure.

FIG. 16 is a schematic cross-sectional view illustrating a power module with a heat dissipation device according to an eighth embodiment of the present disclosure. In the embodiment, the structures, elements and functions of the power module 1g are similar to those of the power module if of FIG. 15, and are not redundantly described herein. Different from the power module if of FIG. 15, in the embodiment, the power module 1g further includes a seventh metal block 427 disposed on the upper surface 102 of the carrier board 410 for the high-power current passing therethrough.

Figure 17:
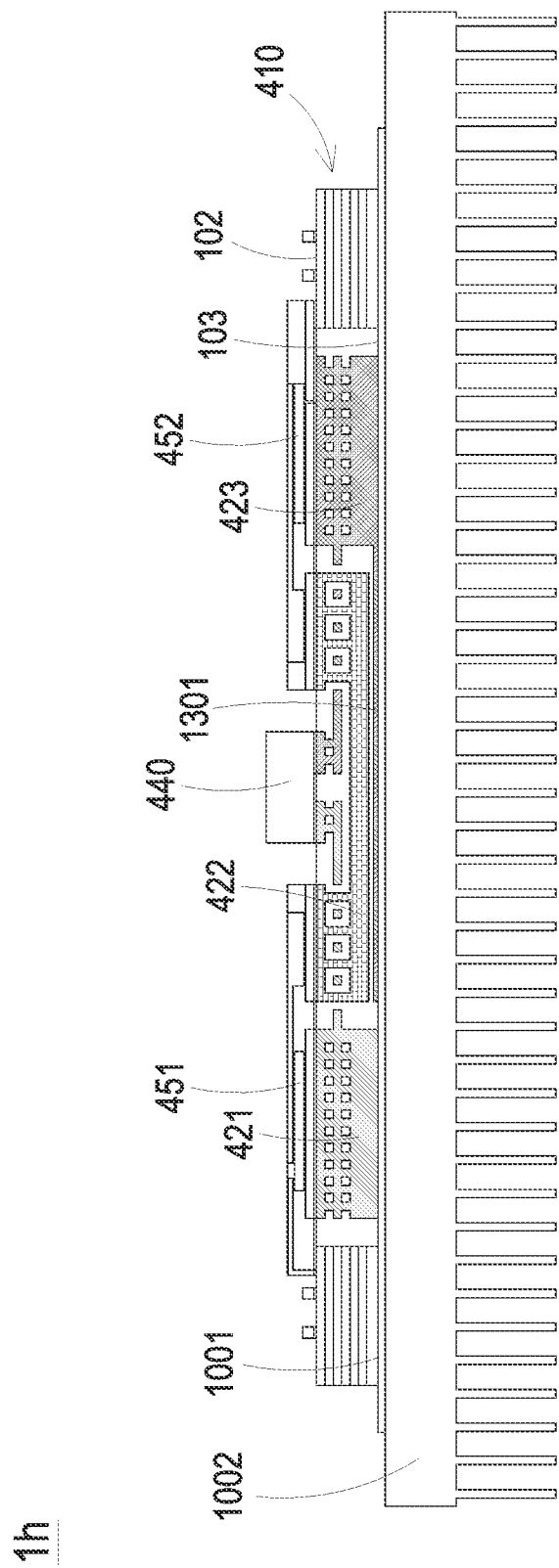
FIG. 17 is a schematic cross-sectional view illustrating a power module according to a ninth embodiment of the present disclosure.

FIG. 17 is a schematic cross-sectional view illustrating a power module with a heat dissipation device according to a ninth embodiment of the present disclosure. In the embodiment, the structures, elements and functions of the power module 1h are similar to those of the power module 1b of FIG. 11, and are not redundantly described herein. In the embodiment, the carrier board 410 further includes a fourth metal-wiring layer 1301. The fourth metal-wiring layer 1301 is disposed under the second metal block 422. At least a part of the fourth metal-wiring layer 1301 is equipotential to the first metal block 421 or the third metal block 423. In the embodiment, the power module 1h includes the fourth metal-wiring layer 1301 disposed under the second metal block 422, and the fourth metal-wiring layer 1301 is connected to the third metal block 423. An insulating material is disposed between the second metal block 422 and the fourth metal-wiring layer 1301 for insulating the second metal block 422 from the fourth metal-wiring layer 1301. In the embodiment, the main heat dissipation paths of the first switch 451 and the second switch 452 are transferred to the first heat dissipating device 1002 through the first metal block 421 and the third metal block 423. Therefore, there is no major impact on the heat dissipation efficiency of the power module 1h by disposing the insulating material and the fourth metal-wiring layer 1301 under the second metal block 422.

On the other hand, it should be noted that in the embodiment, there is a parasitic capacitance generated between the O electrode (refer to FIG. 2B) and the heat sink, and there is also a parasitic capacitance generated between the heat sink and the control circuit. There is a low-impedance connection between the control circuit and the N electrode. In that, an electrical circuit loop is formed from the O electrode to the heat dissipation device, from the heat dissipation device to the control circuit, from the control circuit to the N electrode, and then from the N electrode to the O electrode. When the voltage between the O electrode and the N electrode is changed, the above loop will generate a common mode current, which will generate a voltage drop in the control circuit. The voltage drop is superimposed on the control signal or the sampling signal to cause interference. Setting the N electrode between the O electrode and the heat dissipation device is equivalent to connect a low impedance branch in parallel between the O electrode and the N electrode. Therefore, most of the common mode current is shunted to this branch. Thus, the voltage drop caused by the common-mode current on the control loop is reduced greatly, and the interference to the control signal and the sampling signal is avoided effectively.

Notably, in the embodiment, the first metal block 421 and the third metal block 423 are both quiet grounds. That is, the potential on the first metal block 421 and the potential on the third metal block 423 do not have a high-frequency voltage change. For example, the frequency of the potential change on the first metal block 421 and the third metal block 423 is much lower than the switching frequency of the first switch 451 and the second switch 452 in the power module 1$h$. For example, the frequency of the potential change on the first metal block 421 and the third metal block 423 is less than 1/10 of the switching frequency. In other words, the potentials of the first metal block 421 and the third metal block 423 are relatively stable, the fourth metal-wiring layer 1301 disposed under the second metal block 422 is at the same potential as the first metal block 421. In other embodiments, a part of the fourth metal-wiring layer 1301 has the same potential as the first metal block 421, and another part of the fourth metal-wiring layer 1301 has the same potential as the third metal block 423.

Figure 18:
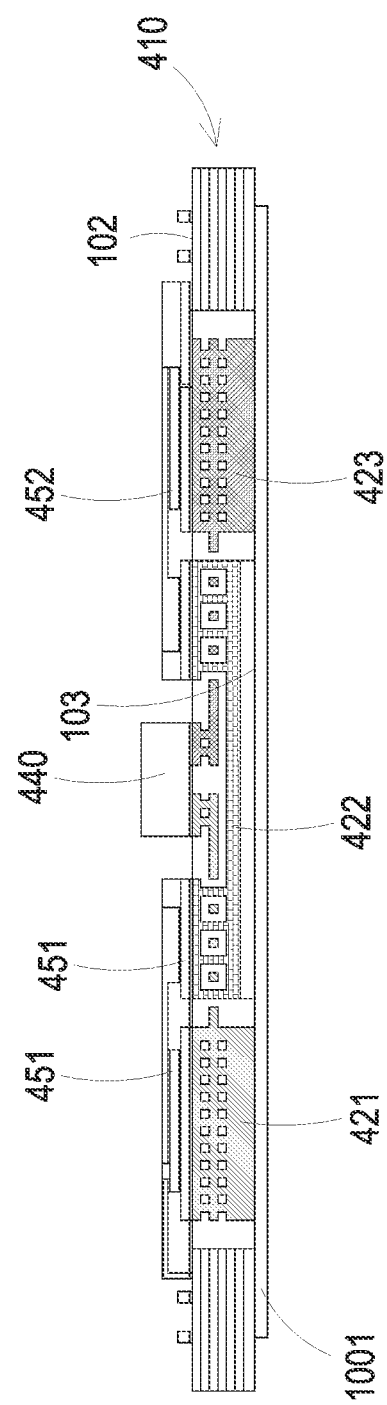
FIG. 18 is a schematic cross-sectional view illustrating a power module according to a tenth embodiment of the present disclosure.

FIG. 18 is a schematic cross-sectional view illustrating a power module according to a tenth embodiment of the present disclosure. In the embodiment, the structures, elements and functions of the power module 1$i$ are similar to those of the power module 1$a$ of FIG. 5, and are not redundantly described herein. In the embodiment, the heights of the bottom surfaces of the first metal block 421, the second metal block 422 and the third metal block 423 are different. The distance from the bottom surface of the second metal block 422 to the bottom surface 103 of the carrier board 410 is greater than the distances from the bottom surfaces of the first metal block 421 and the third metal block 423 to the bottom surface 103 of the carrier board 410. Thereby, the gap between the second metal block 422 and the heat dissipation device is increased to reduce the parasitic capacitance of the second metal block 422 to the bottom surface. The common mode current relative to the heat dissipation device is further eliminated. In the embodiment, the structure of the power module 1$i$ is realized by the prefabricated metal blocks with different thicknesses. Certainly, the present disclosure is not limited thereto. The second metal block 422 does not generate too much heat therefrom, so that the heat dissipation capability of the power module 1$i$ is not influenced.

Figure 19:
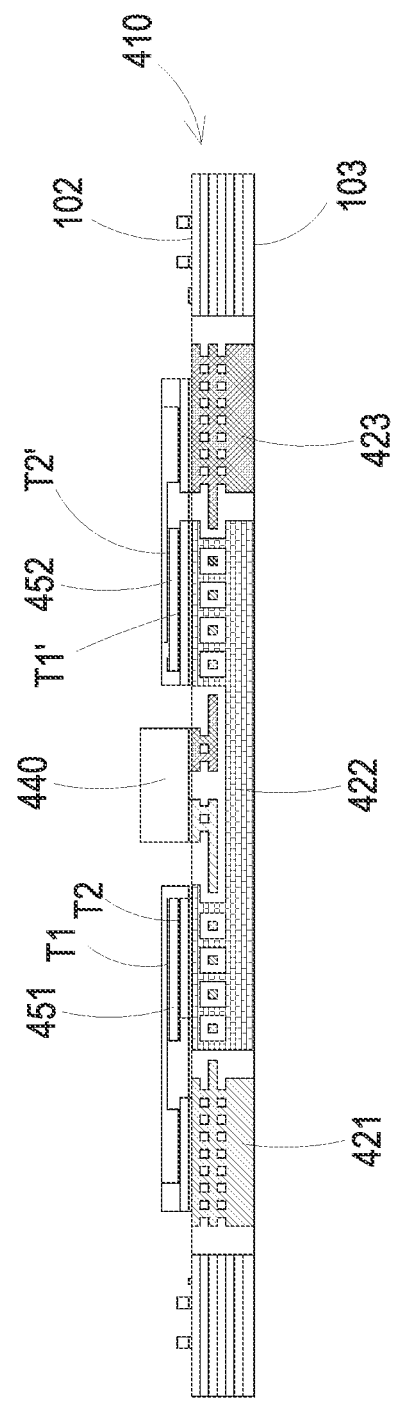
FIG. 19 is a schematic cross-sectional view illustrating a power module according to an eleventh embodiment of the present disclosure.

FIG. 19 is a schematic cross-sectional view illustrating a power module according to an eleventh embodiment of the present disclosure. In the embodiment, the structures, elements and functions of the power module 1$j$ are similar to those of the power module 1$a$ of FIG. 5, and are not redundantly described herein. In the embodiment, the bare chips of the first switch 451 and the second switch 452 of the power module 1$j$ are both disposed above the second metal block 422. The first switch 451 is disposed with the first pad T1 facing upward, the first pad T1 is connected to the first metal block 421, and the second pad T2 is connected to the second metal block 422. The second switch 452 is disposed with the first pad T1' facing downward, the first pad T1' is connected to the second metal block 422, and the second pad T2' is connected to the third metal block 423.

In the embodiment, the potential of the second metal block 422 has a certain voltage jump. For example, the frequency of the potential change on the second metal block 422 is more than 1/10 of the frequency of the first switch 451 and the second switch 452. The first pad T1 on the surface of the first switch 451 and the second pad T2' on the surface of the second switch 452 are stable voltage nodes, that is, a quiet ground. An electromagnetic shielding layer between the second metal block 422 and the driving circuit or the control circuit thereabove is formed by the first pad T1 on the surface of the first switch 451 and the second pad T2' on the surface of the second switch 452. Thus, the electromagnetic interference caused by the voltage jump of the second metal block 422 on the signal of the driving circuit or control circuit disposed thereabove is suppressed.

Figure 20:
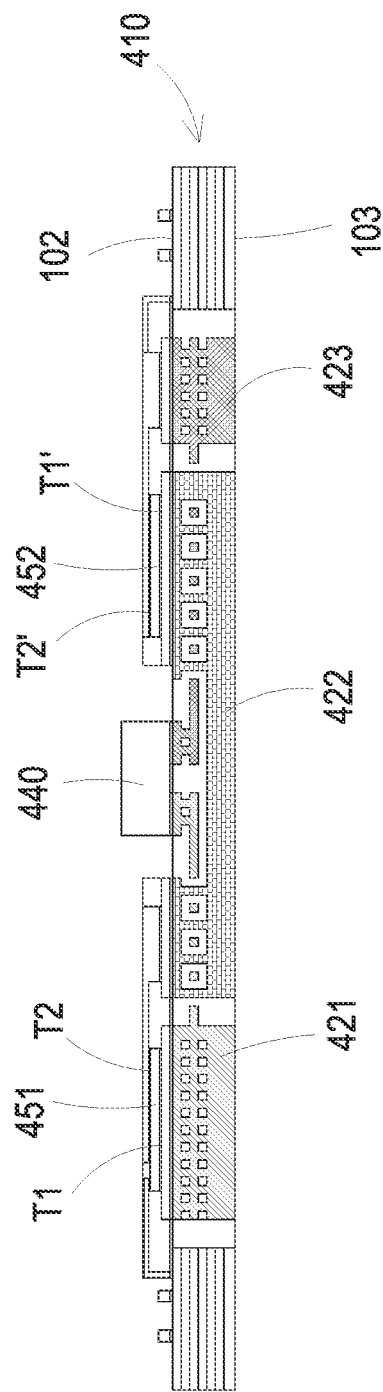
FIG. 20 is a schematic cross-sectional view illustrating a power module according to a twelfth embodiment of the present disclosure.

FIG. 20 is a schematic cross-sectional view illustrating a power module according to a twelfth embodiment of the present disclosure. In the embodiment, the structures, elements and functions of the power module 1$k$ are similar to those of the power module 1$a$ of FIG. 5, and are not redundantly described herein. In the embodiment, the first switch 451 and the second switch 452 of the power module 1$k$ are both vertical devices. In the embodiment, the first switch 451 and the second switch 452 are both disposed on the upper surface 102 of the carrier board 410 with the first pad T1, T1' facing downward.

Figure 21:
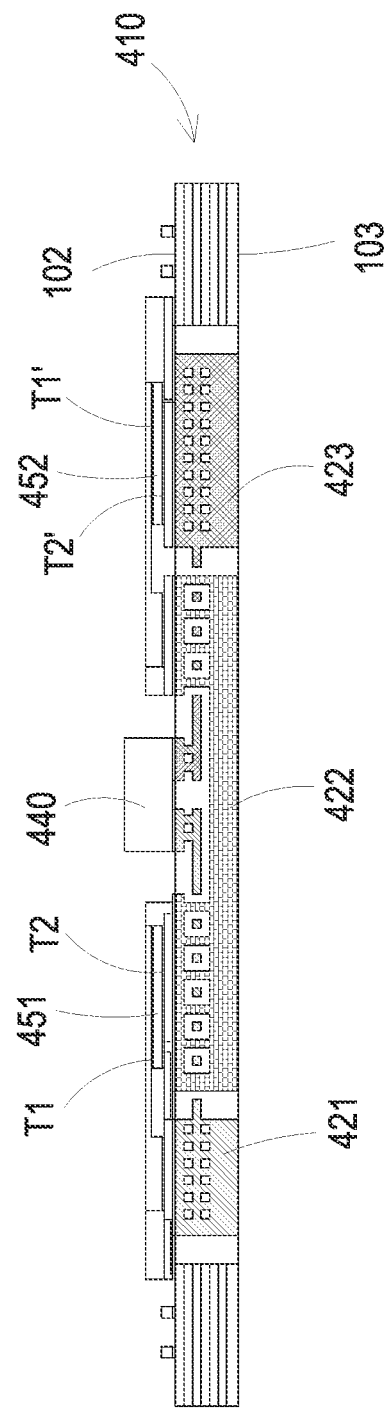
FIG. 21 is a schematic cross-sectional view illustrating a power module according to a thirteenth embodiment of the present disclosure.

FIG. 21 is a schematic cross-sectional view illustrating a power module according to a thirteenth embodiment of the present disclosure. In the embodiment, the structures, elements and functions of the power module 1$m$ are similar to those of the power module 1$a$ of FIG. 5, and are not redundantly described herein. In the embodiment, the first switch 451 and the second switch 452 of the power module 1$m$ are both vertical devices. In the embodiment, the first switch 451 is disposed with the first pad T1 facing upward, and the second switch 452 is disposed with the first pad T1' facing upward. In other embodiment, the first switch 451 and the second switch 452 are planar devices.

Figure 22:
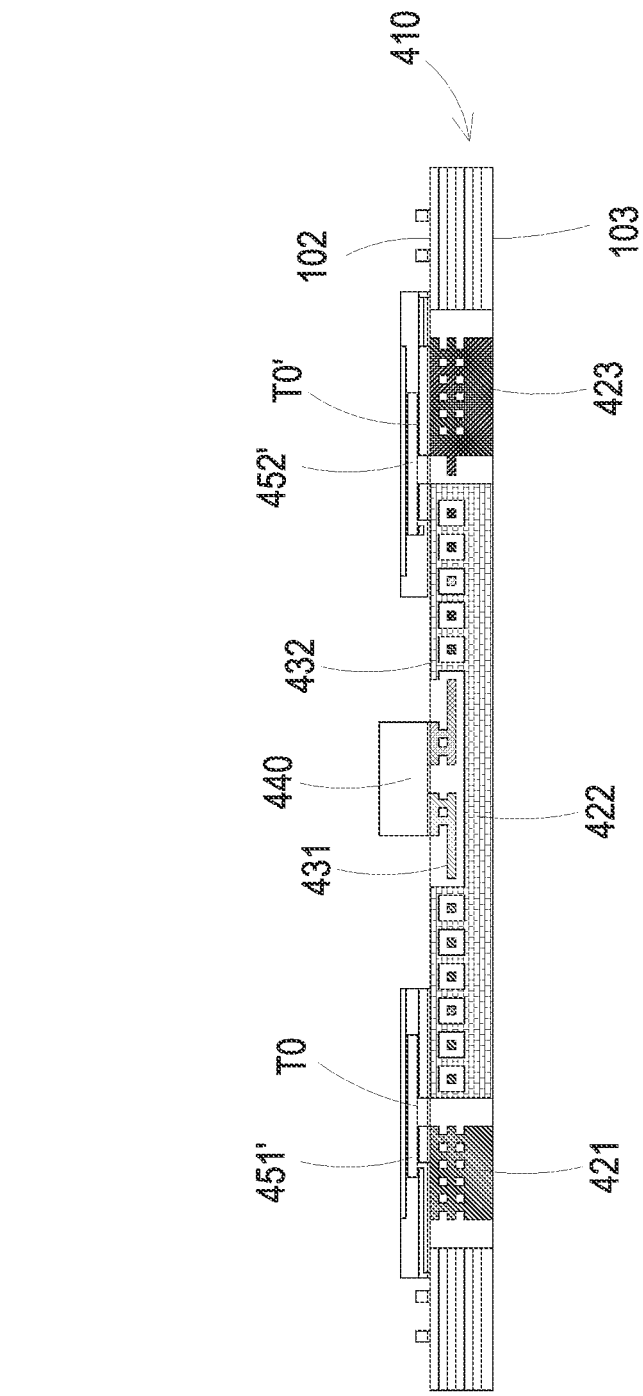
FIG. 22 is a schematic cross-sectional view illustrating a power module according to a fourteenth embodiment of the present disclosure.

FIG. 22 is a schematic cross-sectional view illustrating a power module according to a fourteenth embodiment of the present disclosure. In the embodiment, the structures, elements and functions of the power module 1$n$ are similar to those of the power module 1$a$ of FIG. 5, and are not redundantly described herein. In the embodiment, the first switch 451' and the second switch 452' of the power module 1$n$ are both planar devices, such as GaN HEMT or planar MOSFET. The bare chips of the first switch 451' and the second switch 452' includes a first pad, a second pad and a third pad (not shown), which are located at surfaces of the bare chips. The surfaces are defined as the functional surfaces T0, T0' of the bare chips. In the embodiment, the functional surfaces T0, T0' of the bare chips of the first switch 451' and the second switch 452' are the lower surfaces. The first switch 451' and the second switch 452' are packaged components, and the electrodes are led out through metal connectors on the lower surfaces. In other embodiments, the upper surfaces of the first switch 451' and the second switch 452' include metal connectors, which are completely exposed on the packaged surfaces. In the embodiment, the first switch 451' and the second switch 452' are both disposed on the upper surface 102 of the carrier board 410 with the functional surfaces T0, T0' of the bare chips facing downward.

Figure 23:
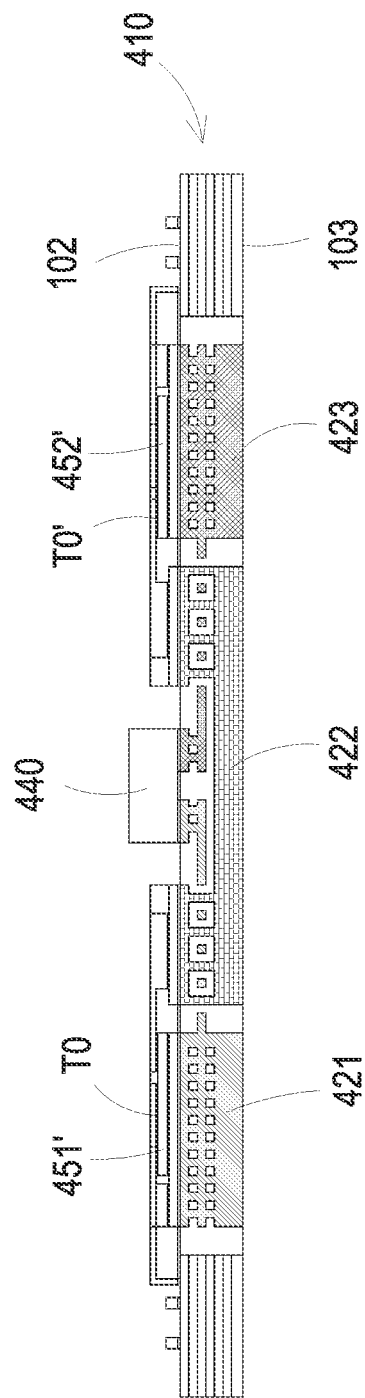
FIG. 23 is a schematic cross-sectional view illustrating a power module according to a fifteenth embodiment of the present disclosure.

FIG. 23 is a schematic cross-sectional view illustrating a power module according to a fifteenth embodiment of the present disclosure. In the embodiment, the structures, elements and functions of the power module 1$o$ are similar to those of the power module 1$a$ of FIG. 5, and are not redundantly described herein. In the embodiment, the first switch 451' and the second switch 452' of the power module 1$o$ are both planar devices. In the embodiment, the first switch 451' and the second switch 452' are both disposed on the carrier board 410 with the functional surfaces T0, T0' of the bare chips facing upward.

Figure 24:
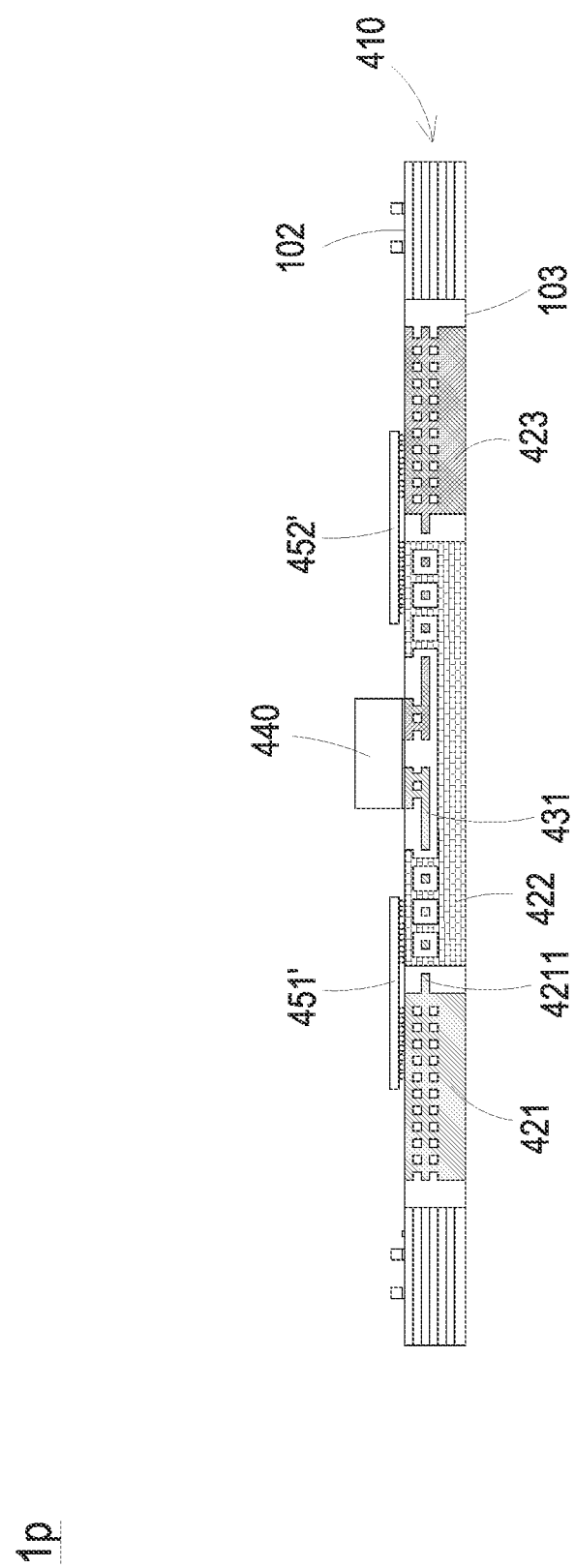
FIG. 24 is a schematic cross-sectional view illustrating a power module according to a sixteenth embodiment of the present disclosure.

FIG. 24 is a schematic cross-sectional view illustrating a power module according to a sixteenth embodiment of the present disclosure. In the embodiment, the structures, elements and functions of the power module 1$p$ are similar to those of the power module 1$a$ of FIG. 5, and are not redundantly described herein. In the embodiment, the first switch 451' and the second switch 452' of the power module 1p are planar devices, such as GaN HEMT, which is in the form of flip chip or not. The chip becomes a packaged component through secondary packaging. The packaged component is flip-chip mounted on the carrier board 410. The bare chip areas of the first switch 451' and the second switch 452' are overlapped with the projections of the first metal block 421 and the second metal block 422 on the lower surface 103 of the carrier board 410, and the overlap ratio is relatively the same. In that, the first metal block 421, the second metal block 422 and the third metal block 423 are provided for conduction and heat dissipation at the same time. It should be noted that only the main power electrodes of the first switch 451' and the second switch 452' are shown in FIG. 24.

In the embodiment, the carrier board 410 of the power module 1p further includes a first connection portion 4211. The first metal block 421 is connected to the first metal-wiring layer 431 through the first connection portion 4211. The first connection portion 4211 and the first metal-wiring layer 431 are located at the same layer. Preferably but not exclusively, the first connection portion 4211 and the first metal-wiring layer 431 are located at the same height.

Figure 25:
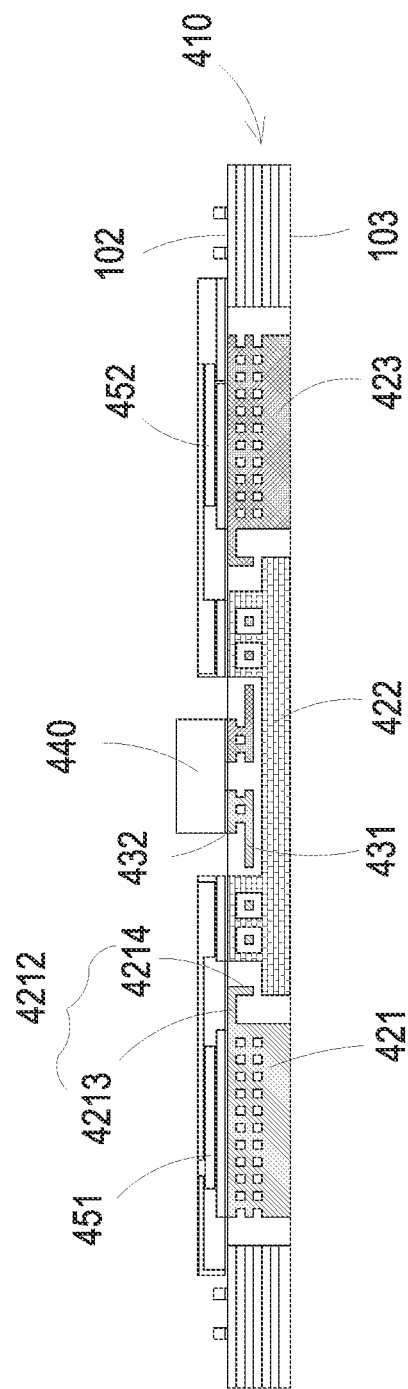
FIG. 25 is a schematic cross-sectional view illustrating a power module according to a seventeenth embodiment of the present disclosure.

FIG. 25 is a schematic cross-sectional view illustrating a power module according to a seventeenth embodiment of the present disclosure. In the embodiment, the structures, elements and functions of the power module 1q are similar to those of the power module 1a of FIG. 5, and are not redundantly described herein. In the embodiment, the carrier board 410 of the power module 1q further includes a second connection portion 4212. The first metal block 421 is connected to the first metal-wiring layer 431 through the second connection portion 4212. The second connection portion 4212 includes a horizontal portion 4213 and a bending portion 4214. The horizontal portion 4213 and the second metal-wiring layer 432 are located at the same layer. Moreover, the bending portion 4214 is connected between the horizontal portion 4123 and the first metal-wiring layer 432.

Figure 26:
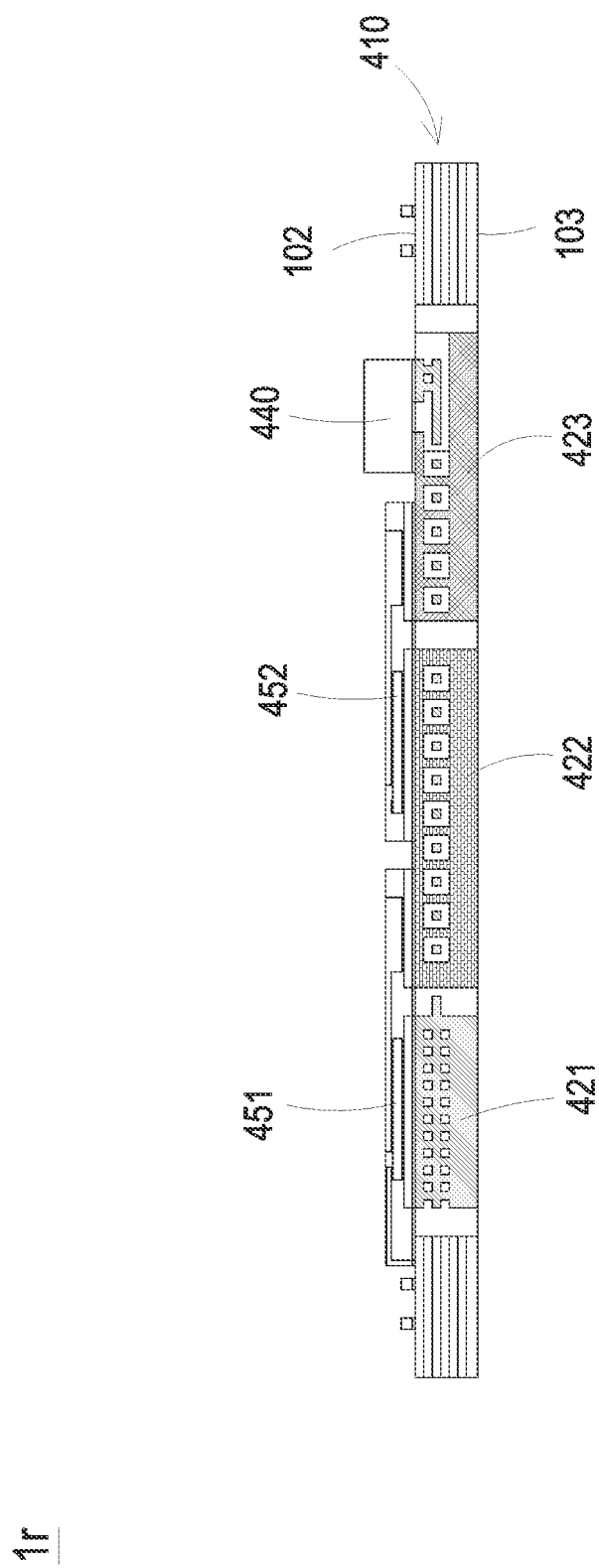
FIG. 26 is a schematic cross-sectional view illustrating a power module according to an eighteenth embodiment of the present disclosure.

FIG. 26 is a schematic cross-sectional view illustrating a power module according to an eighteenth embodiment of the present disclosure. In the embodiment, the structures, elements and functions of the power module 1r are similar to those of the power module 1a of FIG. 5, and are not redundantly described herein. In the embodiment, the clamping component 440 of the power module 1r is located at the right side of the second switch 452. Certainly, in other embodiments, the clamping component 440 is located at the left side of the first switch 451. Preferably but not exclusively, in the embodiment, the clamping component 440 is a capacitor. In other embodiments, the clamping component 440 is for example but not limited to the clamping circuit shown in FIG. 3, or other electronic devices or electronic circuits with a clamping function.

In the embodiment, the first switch 451 and the second switch 452 correspond to the switch S1 and the switch S2 connected in series as shown in FIG. 2B. The clamping component 440 corresponds to the capacitor Cin shown in FIG. 2B. The capacitor Cin is connected in parallel with the branch of the switch S1 and the switch S2 connected in series, so as to clamp the voltage at both pads of the switch S1 and the switch S2. In the embodiment, the carrier board 410 is a printed circuit board including a first metal block 421, a second metal block 422 and a third metal block 423 disposed therein. Corresponding to FIG. 2B, the first metal block 421 is connected to the P electrode, the second metal block 422 is connected to the O electrode, and the third metal block 423 is connected to the N electrode. The second metal block 422 is located between the first metal block 421 and the third metal block 423. Preferably but not exclusively, the first metal block 421, the second metal block 422 and the third metal block 423 may be prefabricated metal blocks, including preformed thick metal materials.

Figure 27:
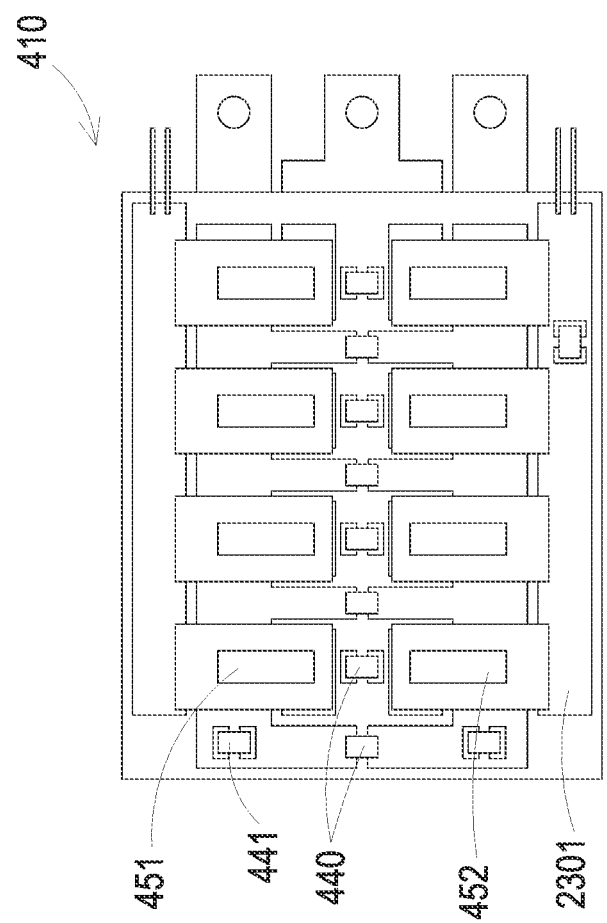
FIG. 27 is a schematic cross-sectional view illustrating a power module according to a nineteenth embodiment of the present disclosure.

FIG. 27 is a schematic cross-sectional view illustrating a power module according to a nineteenth embodiment of the present disclosure. In the embodiment, the structures, elements and functions of the power module 10a are similar to those of the power module 1a of FIG. 4, and are not redundantly described herein. In the embodiment, the power module 10a includes four pairs of half bridges of the first switch 451 and the second switch 452. The four pairs of half bridges are connected in parallel to form the power module 10a. In the embodiment, a clamping component 440 is provided between each pair of the first switch 451 and the second switch 452. Preferably but not exclusively, the electrode pad corresponding to the clamping component 440 is led out by the same structure as that shown in the power module 1a of FIG. 4. In other embodiments, the electrode pad corresponding to the clamping component 440 is led out through the surface copper between the adjacent first switch 452 and second switch 452. A pair of the first switch 451 and the second switch 452 corresponds to one or more clamp capacitors. The specific number is adjustable according to the practical requirements. In the embodiment, a driving clamp circuit element 441 is further disposed between the first switch 451 and the second switch 452. Moreover, a driving control area 2301 is provided on the periphery of the switches, and the driving control area 2301 is used for bus line connection and disposing the required driving and controlling components. It should be noted that the surface wiring in FIG. 27 is only for illustration. The present disclosure is not limited thereto.

Figure 28:
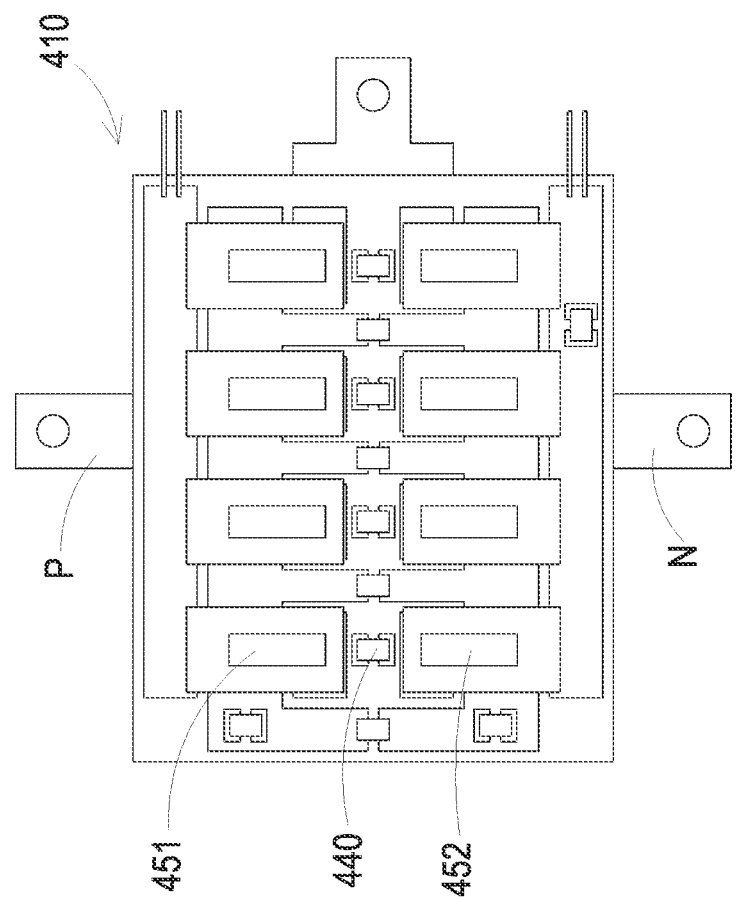
FIG. 28 is a schematic cross-sectional view illustrating a power module according to a twentieth embodiment of the present disclosure.

FIG. 28 is a schematic cross-sectional view illustrating a power module according to a twentieth embodiment of the present disclosure. In the embodiment, the structures, elements and functions of the power module 10b are similar to those of the power module 10a of FIG. 27, and are not redundantly described herein. In the embodiment, the electrodes of the half-bridge power module 10b are led out according to another layout. The P electrode and the N electrode are extended and led out directly through the first metal block 421 and the third metal block 423 (refer to FIG. 1A), respectively, so as to meet the pin requirements of different systems and adjust the creepage distance between the electrodes.

In the embodiment, the power module 10b further includes a molding material (not shown), and the molding material covers the first switch 451 and the second switch 452, respectively. In order to reduce the horizontal electrical gap between the exposed electrodes of the switches, molding, potting, spray coating, underfilling and other methods can be used for molding, so that the air insulation is replaced by the solid insulation. In this way, the electrical gap is reduced greatly, and the size of the carrier board 410 is reduced.

In the embodiment, in order to make the insulating material easy to be applied to the power device 10b, when the bare chip is packaged, an air zone is formed on the plane of electrodes and located between the terminals, such as between the drain and the source of the MOSFET. In the embodiment, an air zone without the molding material is formed between the first pad T1 and the second pad T2 of the first switch 451. Moreover, an air zone without the molding material is formed between the first terminal T1' and the second terminal T2' of the second switch 452. For example, the first switch 451 and the second switch 452 have the same structure as the power device 1201 shown in FIG. 29. The two electrodes on the first side of the power device 1201 are led out through the terminal 1202 and the terminal 1203, respectively. The second side of the power device 1201 and the terminal 1203 are connected through the connecting bridge 1204. The air zone 1206 without the molding material 1205 is formed between the terminal 1202 and the terminal 1203. With the arrangement of the air zone 1206, it facilitates the insulating material to be added subsequently between the two high voltage terminals for filling. In other embodiments, a recess or an open area is formed between the two terminals of the carrier board 410 to facilitate the filling process of the insulating material. Furthermore, the bare chip of the power device can be directly mounted on the carrier board 410. The side of the bare chip adjacent to the carrier board 410 is electrically connected to the surface pad of the carrier board 410 by welding or sintering. Another side of the bare chip away from the carrier board 410 is electrically connected to the carrier board 410 through metal bridges or bonding wires. Thereafter, the whole structure is protected by the molding to form the insulation protection. Compared with the discrete device, the bare chip is mounted directly, and it is advantageous for reducing the additional connection impedance caused by packaging of the discrete devices. Certainly, the present disclosure is not limited thereto.

Figure 30:
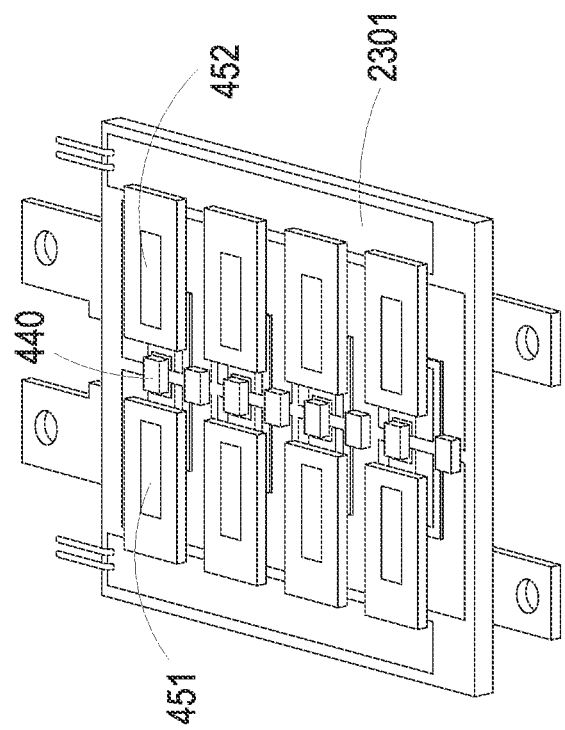
FIG. 30 is a schematic cross-sectional view illustrating a power module according to a twenty-first embodiment of the present disclosure.

In the embodiment, each pair of the first switch 451 and the second switch 452 in the power module 10b are connected in series, and configured to form a circuit of a half-bridge structure as shown in the power module 1a of FIG. 4. In an embodiment, the series connection of the first switch 451 and the second switch 452 is used as a part of the circuit and applied to a full-bridge structure to form the structure of power module 10c, which is the twenty-first embodiment of the present disclosure as shown in FIG. 30. Certainly, in other embodiments, the series connection of the first switch 451 and the second switch 452 is applied to various more complex circuit structures, such as TNPC, DNPC, ANPC and other neutral point clamping (NPC) circuits. As long as the circuit has a structure in which the first switch 451 and the second switch 452 are connected in series, the power module 10b in the foregoing embodiment can be applied without limitation.

Figure 31:
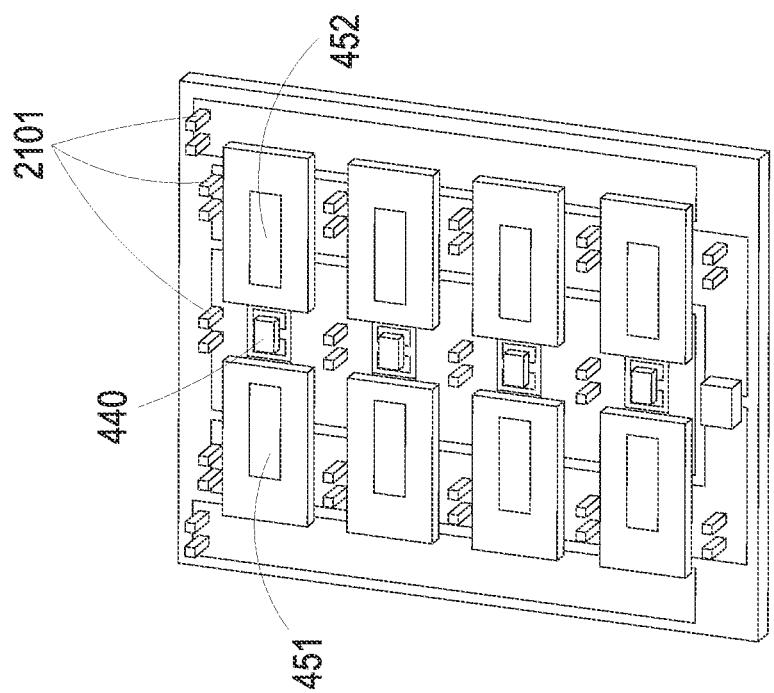
FIG. 31 is a schematic cross-sectional view illustrating a power module according to a twenty-second embodiment of the present disclosure.

FIG. 31 is a schematic cross-sectional view illustrating a power module according to a twenty-second embodiment of the present disclosure. As shown in FIG. 31, the power module 10d includes a surface mount (SMT) structure. The terminal 2101 is located on the upper surface of the power module 10d, connected to the first metal block 421, the second metal block 422 and the third metal block 423 (refer to FIG. 1A), and connected to the electrodes on a driving board, so that a more flexible terminal position design is realized.

Figure 32:
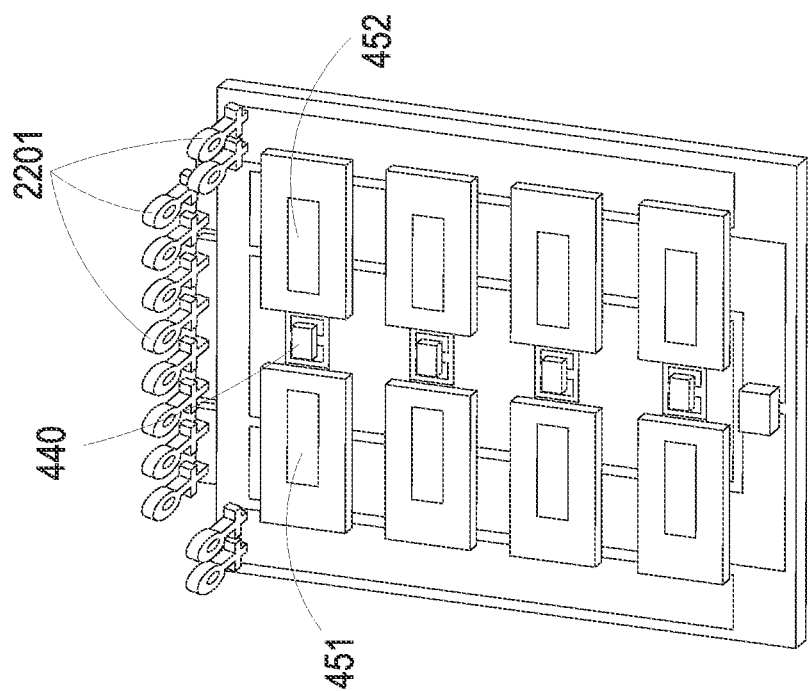
FIG. 32 is a schematic cross-sectional view illustrating a power module according to a twenty-third embodiment of the present disclosure.

FIG. 32 is a schematic cross-sectional view illustrating a power module according to a twenty-third embodiment of the present disclosure. The terminal 2201 of the power module 10e is a press-fit structure, which is easier to install and provides better terminal connection reliability.

In other embodiments, the power module 10e further includes a driving circuit for driving the first switch 451 and the second switch 452.

Figure 33:
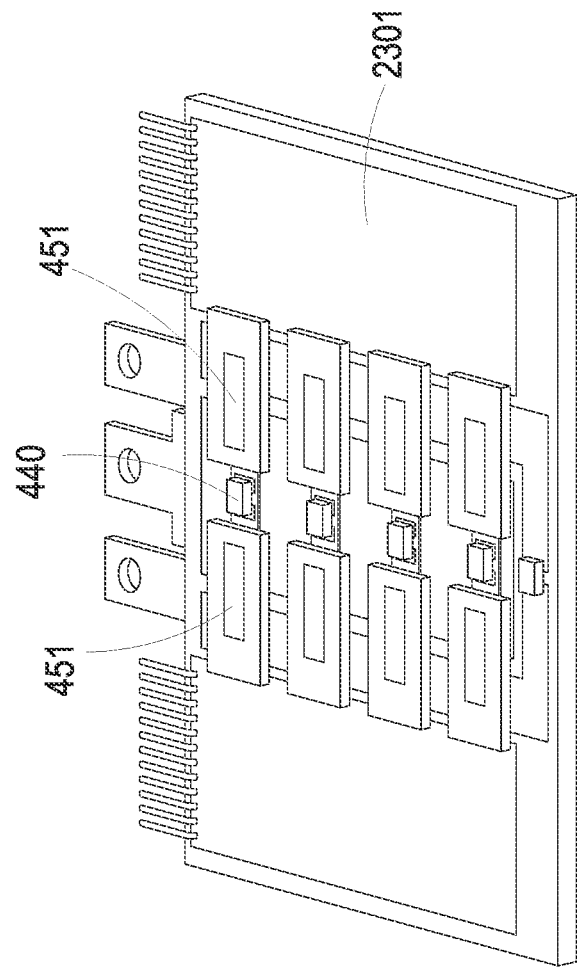
FIG. 33 is a schematic cross-sectional view illustrating a power module according to a twenty-fourth embodiment of the present disclosure.

FIG. 33 is a schematic cross-sectional view illustrating a power module according to a twenty-fourth embodiment of the present disclosure. In the embodiment, the structures, elements and functions of the power module 10f are similar to those of the power module 10a of FIG. 27, and are not redundantly described herein. In the embodiment, the power module 10f includes a driving/control region 2301. Preferably but not exclusively, a driving chip, a control chip, a protection circuit, a resistor, a capacitor and other components are integrated in the driving/control region 2301 to realize driving signal output, Miller clamping, protection of signal collection and processing, communication with superior control and other functions.

Figure 34A:
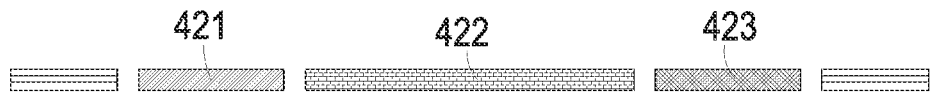
FIGS. 34A to 34E are schematic cross-sectional views showing a manufacturing process of a power module according to an embodiment of the present disclosure.
Figure 34B:
Figure 34C:
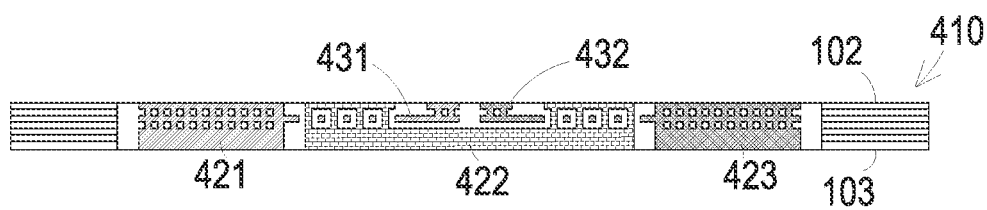
Figure 34D:
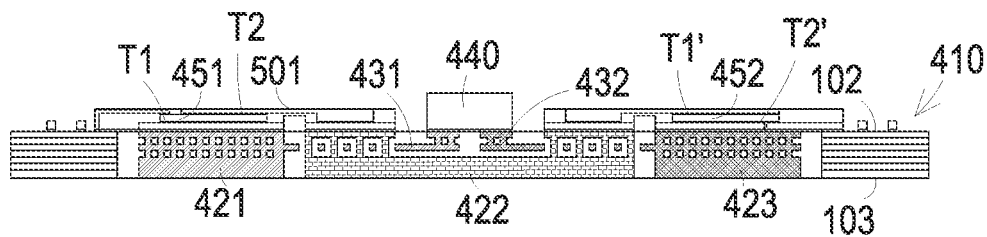
Figure 34E:
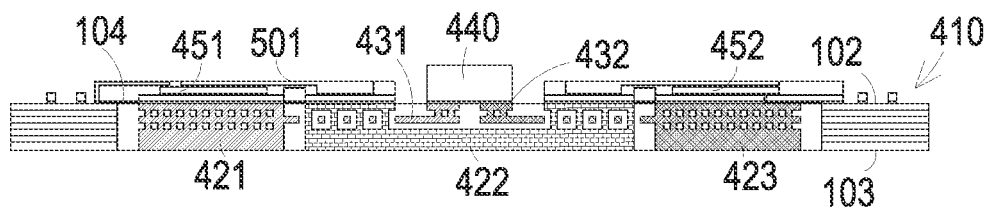
Figure 35:
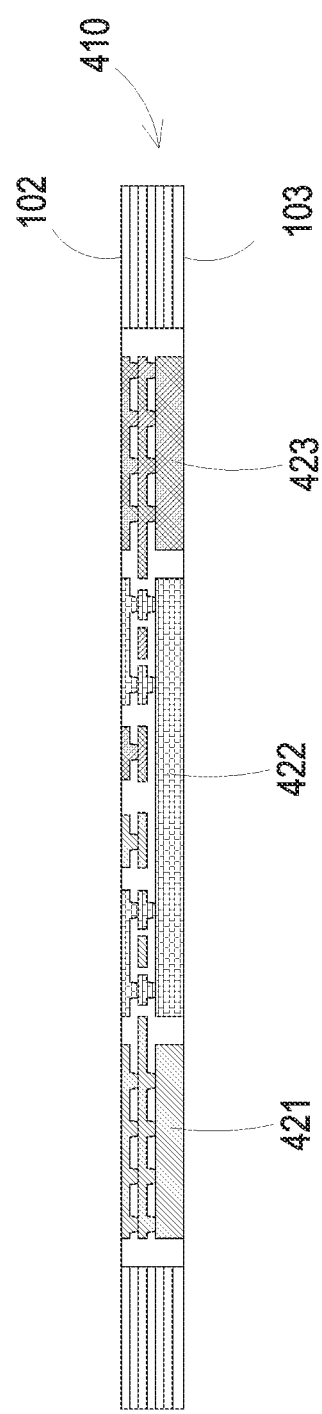
FIG. 35 is a schematic cross-sectional view illustrating the carrier board produced in the manufacturing process of the power module.

In addition, according to the aforementioned structural concept of the power module 1a, the present disclosure further provides a manufacturing method of the power module. As shown in FIGS. 34A to 34E, the manufacturing method of the power module of the present disclosure includes the following steps. In the first step, the first metal block 421, the second metal block 422 and the third metal block 423 are prefabricated, as shown in FIG. 34A. In the second step, the prefabricated first metal block 421, the second metal block 422, the third metal block 423 and a core board 100 are pressed into an integral carrier board by insulating materials. The second metal block 422 is located between the first metal block 421 and the third metal block 423, as shown in FIG. 34B. In the third step, a wiring processing is performed on the carrier board through drilling, copper sinking, electroplating and etching in the PCB process, so as to form the structure shown in FIG. 35. The first metal-wiring layer 431 and the second metal-wiring layer 432 are formed on the carrier board 410 as shown in FIG. 34C. In the fourth step, a first switch 451, a second switch 452 and a clamping component 440 are connected to the carrier board 410. In the embodiment, the first switch 451 and the second switch 452 are connected to the clamping component 440 through the first metal-wiring layer 431 and the second metal-wiring layer 432. Each of the first switch 451 and the second switch 452 has a first pad T1, T1' and a second pad T2, T2'. The first pad T1 of the first switch 451 is connected to the first metal block 421. the second pad T2 of the first switch 451 is connected to the second metal block 422 through the second metal-wiring layer 432. The first pad T1' of the second switch 452 is connected to the second metal block 422 through the second metal-wiring layer 432. The second pad T2' of the second switch 452 is connected to the third metal block 423, as shown in FIG. 34D. In the fifth step, the gaps between the first switch 451 and the carrier board 410 and between the second switch 452 and the carrier board 410 are filled with the insulating material 104 by potting or injection to perform electrical insulation and environmental protection, as shown in FIG. 34E.

Notably, the core board 100 is not necessary in the above process, and the fifth step is not necessary.

Notably, in other embodiments, the first metal block, 421, the second metal block 422 and the third metal block 423 are formed into individual components by molding or dispensing, and then laminated to form the carrier board 410 in one piece by insulating materials.

Notably, the process of forming the insulating material between the metal-wiring layers is for example but not limited to a PCB lamination process. In an embodiment, it is achieved by means such as chemical vapor deposition or spraying, to meet different withstand voltage and thickness requirements. In other embodiments, one or more processing methods are used to form the composite insulating material.

Figure 36:
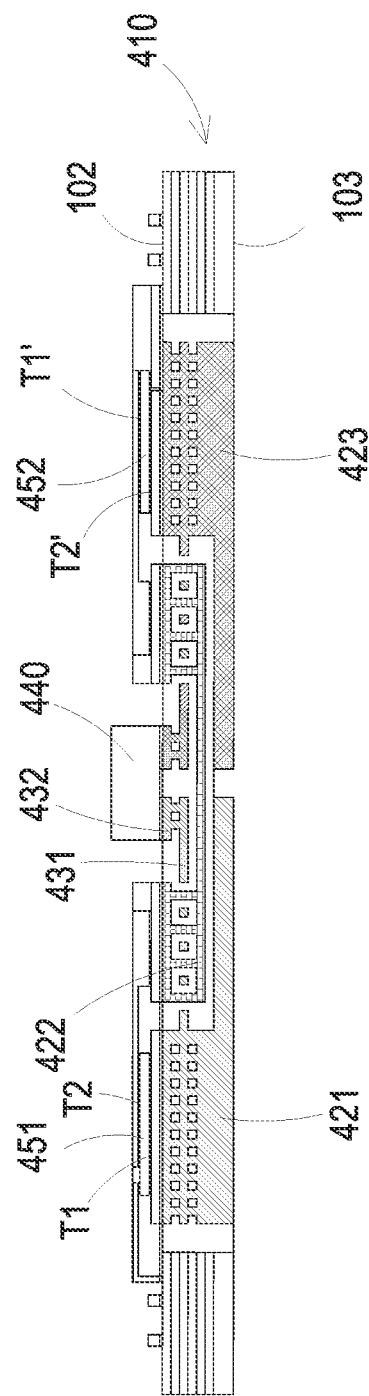
FIG. 36 is a schematic cross-sectional view illustrating a power module according to a twenty-fifth embodiment of the present disclosure.

FIG. 36 is a schematic cross-sectional view illustrating a power module according to a twenty-fifth embodiment of the present disclosure. In the embodiment, the structures, elements and functions of the power module is are similar to those of the power module 1a of FIG. 5, and are not redundantly described herein. In the embodiment, in the carrier 410 of the power module 1s, a part of the first metal block 421 and a part of the third metal block 423 are extended below the O electrode. The require shapes of the first metal block 421 and the third metal block 423 are prefabricated. The metal conductive layer for the O electrode is realized by the PCB process. Since the copper blocks of the first metal block 421 and the third metal block 423 are larger in the width direction, the heat dissipation capability is further increased. At the same time, the first metal block 421 and the third metal block 423 are further extended below the O electrode, and it is help to realize the EMI shielding. In the embodiment, the first metal block 421 and the third metal block 423 need to perform heat dissipation and conduction functions at the same time, and the second metal block 422 only performs conduction functions. Preferably but not exclusively, the first metal block 421 and the third metal block 423 are formed by prefabricated metal blocks. The second metal block 422 is formed by a conventional thick copper process of PCB, such as laminating pre-prepared copper foil, electroplating copper or thickening plating based on thin copper. In an embodiment, the second metal block 422 is a metal conductor formed by a PCB process with the same thickness as the first metal-wiring layer 431 or the second metal-wiring layer 432.

Figure 37:
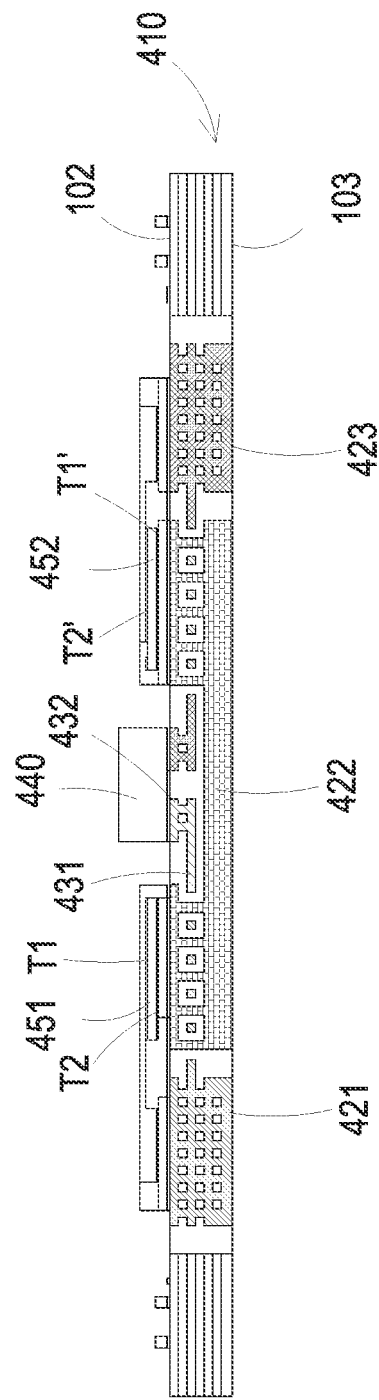
FIG. 37 is a schematic cross-sectional view illustrating a power module according to a twenty-sixth embodiment of the present disclosure.

FIG. 37 is a schematic cross-sectional view illustrating a power module according to a twenty-sixth embodiment of the present disclosure. In the embodiment, the structures, elements and functions of the power module 1t are similar to those of the power module 1a of FIG. 5, and are not redundantly described herein. In the embodiment, the carrier board 410 of the power module 1t includes the bare chips of the first switch 451 and the second switch 452 located above the second metal block 422. The second metal block 422 is the main heat dissipation path. Preferably but not exclusively, the second metal block 422 of the carrier board 410 is a prefabricated metal block. The P electrode and N electrode are formed by conventional thick copper processes of PCB, such as laminating pre-prepared copper foil, electroplating copper or thickening plating based on thin copper. Certainly, the first metal block 421 and the third metal block 422 are metal conductors with the same thickness as the first metal-wiring layer 431 or the second metal-wiring layer 432 formed by a PCB process.

Figure 38:
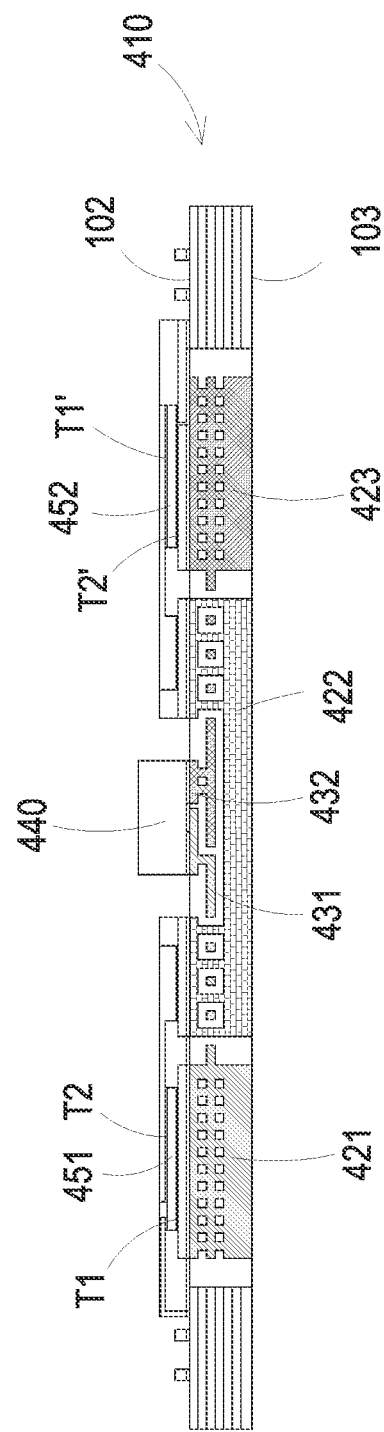
FIG. 38 is a schematic cross-sectional view illustrating a power module according to a twenty-seventh embodiment of the present disclosure.

FIG. 38 is a schematic cross-sectional view illustrating a power module according to a twenty-seventh embodiment of the present disclosure. In the embodiment, the structures, elements and functions of the power module 1u are similar to those of the power module 1a of FIG. 5, and are not redundantly described herein. In the embodiment, the carrier 410 of the power module 1u includes the first metal-wiring layer 431 and the second metal-wiring layer 432 below the clamping element 440, which have projections at least partially overlapped on the carrier board 410. The current direction of the clamping circuit in the overlapped portion of the first metal-wiring layer 431 is opposite to that in the overlapped portion of the second metal-wiring layer 432, so that the high frequency loop inductance is further reduced.

Figure 29:
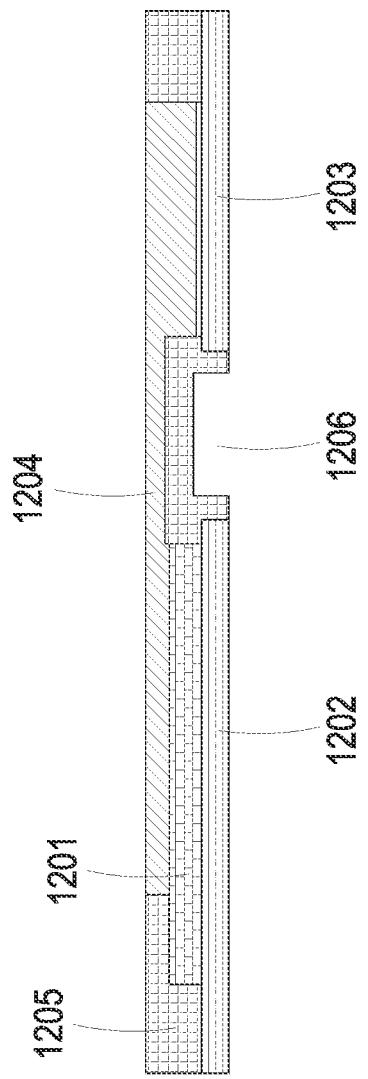
FIG. 29 is a schematic cross-sectional view illustrating a third example of the switch of the present disclosure.

Moreover, please refer to FIG. 29. The manufacturing method of the power module provided by the embodiments of the present disclosure further includes the following step. A molding material 1205 is formed to cover the first switch 451 and the second switch 452. Preferably but not exclusively, an air zone 1206 without the molding material is formed between the first pad T1 and the second pad T2 of the first switch 451.

Figure 40:
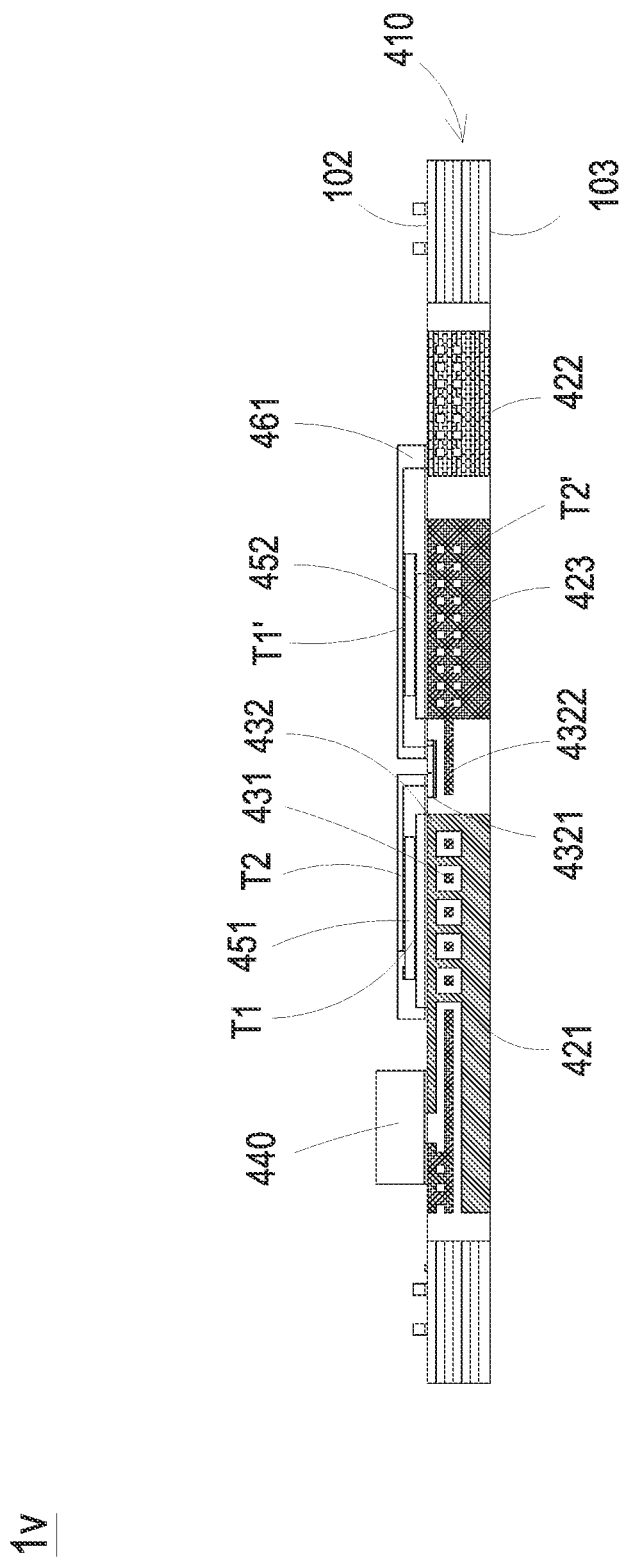
FIG. 40 is a schematic cross-sectional view illustrating a power module according to a twenty-eighth embodiment of the present disclosure.

FIG. 40 is a schematic cross-sectional view illustrating a power module according to a twenty-eighth embodiment of the present disclosure. In the embodiment, the structures, elements and functions of the power module 1v are similar to those of the power module 1a of FIG. 5, and are not redundantly described herein. In the embodiment, the power module 1v includes a carrier board 410, a first switch 451, a second switch 452, at least one metal block 421, 422, 423, a clamping component 440 and a metal conductive component 461. The carrier board 410 includes an upper surface 102, a lower surface 103, a positive terminal connected to the P electrode and a negative terminal connected to the N electrode. The first switch 451 and the second switch 452 are disposed on the upper surface 102 and connected in series to form a bridge arm electrically connected between the positive terminal and the negative terminal. The at least one metal block 421, 422, 423 is disposed between the upper surface 102 and the lower surface 103, and electrically connected to the first switch 451 and/or the second switch 452. The clamping component 440 is disposed on the upper surface 102 and electrically connected in parallel with the bridge arm through the carrier board 410. The metal conductive component 461 is connected from a common node of the first switch 451 and the second switch 452 to an output terminal, such as the O electrode. The metal conductive component 461 is located at a side of the first switch 451 and the second switch 452 away from the upper surface 102. In the embodiment, the first pad T1 of the first switch 451 is connected to the first metal block 421. The second pad T2 of the first switch 451 is connected to the first pad T1' of the second switch 452 through the trace 4321 on the second metal-wiring layer 432, and connected to the second metal block 422. Since the area of the trace 4321 on the second metal-wiring layer 432 connected to the second pad T2 of the first switch 451 and the first pad T1' of the second switch 452 is very small, the capacitor formed between the trace 4321 and the trace 4322 having the same polarity as the N electrode on the first metal-wiring layer 431 is small. Since the capacitor is connected between the first pad T1' of the second switch 452 and the N electrode, it becomes a part of the output capacitor between the first pad T1' and the second pad T2' of the second switch 452. The capacitor has a greater impact on the switching loss of the switching component. When the output capacitor is small, the switching loss of the switch is also small. Since the overlapping area between the trace 4321 and the N electrode is small, the capacitor generated therefrom is also small accordingly. In other embodiments, the trace 4321 on the second metal-wiring layer 432 connected to the second pad T2 of the first switch 451 and the first pad T1' of the second switch 452 are correspondingly disposed above the P electrode. The second pad T2' of the second switch 452 is connected to the third metal block 423, and the first switch 451 and the second switch 452 are connected to the clamping element 440 through the first metal-wiring layer 431 and the second metal-wiring layer 432. The clamping component 440 is located at the left side of the first switch 451 or at the right side of the second switch 452. In other embodiments, the clamping components 440 are disposed on the left side of the first switch 451 and the right side of the second switch 452 at the same time. In the embodiment, the first switch 451 and the second switch 452 are discrete devices. The metal block in the present disclosure is considered as a metal conductor with a thickness greater than 0.3 mm.

Figure 41:
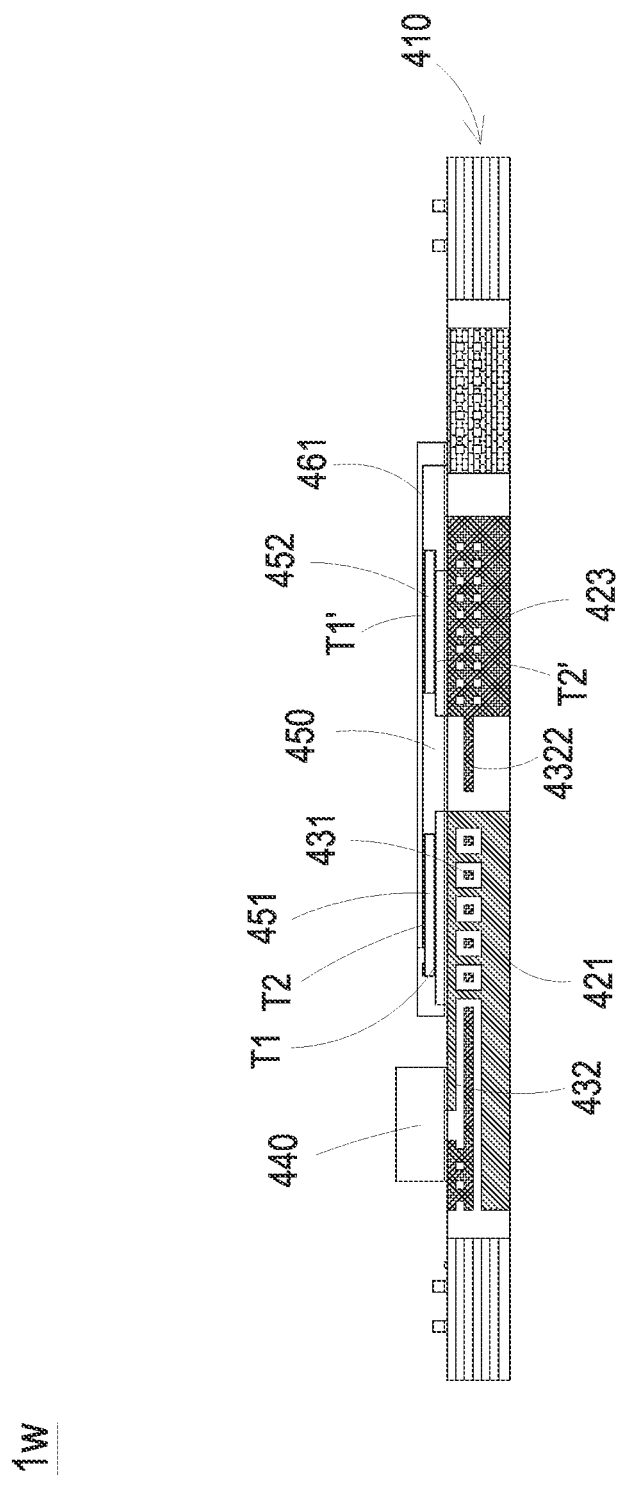
FIG. 41 is a schematic cross-sectional view illustrating a power module according to a twenty-ninth embodiment of the present disclosure.

FIG. 41 is a schematic cross-sectional view illustrating a power module according to a twenty-ninth embodiment of the present disclosure. In the embodiment, the structures, elements and functions of the power module 1w are similar to those of the power module 1a of FIG. 5, and are not redundantly described herein. In the embodiment, the power module 1w includes the first switch 451 and the second switch 452, which are integrally formed as a switch assembly 450. The second pad T2 of the first switch 451 and the first pad T1' of the second switch 452 are connected through the metal conductive component 461 in the switch assembly 450. There is no need to dispose the trace 4321 on the carrier board 410 for connecting the second pad T2 of the first switch 431 and the first pad T1' of the second switch 432. Compared with the trace 4321 in FIG. 40, the distance between the metal conductive component 461 and the trace 4322 is longer, and the capacitor between the metal conductive component 461 and the trace 4322 is smaller. Thus, the output capacitors of the first switch 451 and the second switch 452 are also smaller, and the switching losses of the first switch 451 and the second switch 452 are correspondingly reduced.

Figure 42:
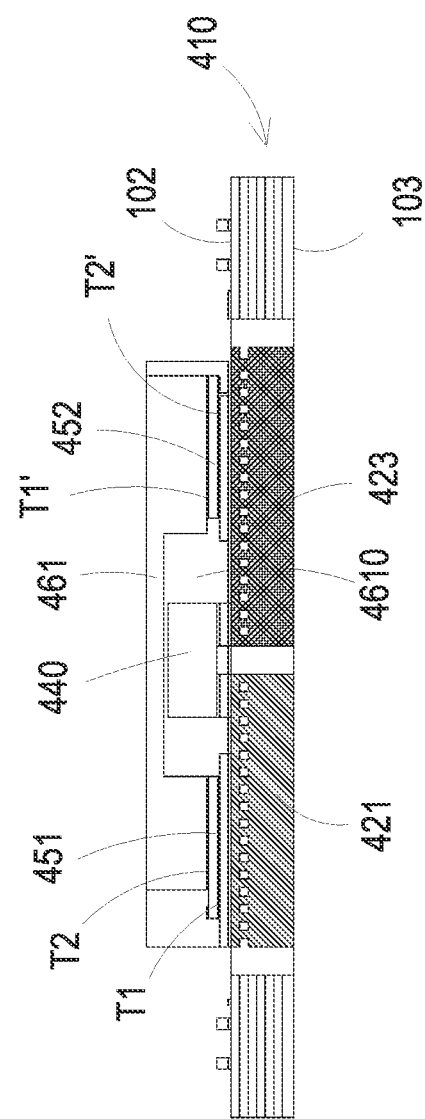
FIG. 42 is a schematic cross-sectional view illustrating a power module according to a thirtieth embodiment of the present disclosure.

FIG. 42 is a schematic cross-sectional view illustrating a power module according to a thirtieth embodiment of the present disclosure. In the embodiment, the structures, elements and functions of the power module 1x are similar to those of the power module 1v of FIG. 40, and are not redundantly described herein. In the embodiment, the first pad T1 of the first switch 451 is connected to the first metal block 421. The second pad T2 of the first switch 451 is connected to the first pad T1' of the second switch 452 through the metal conductive component 461. The second pad T2' of the second switch 452 is connected to the third metal block 423. The first pad T1 of the first switch 451 and the second pad T2' of the second switch 452 are connected to the clamping component 440. The clamping component 440 is located between the first switch 451 and the second switch 452, and the metal conductive component 461 is located above the clamping component 440 and is connected to the first switch 451 and the second switch 452. The first switch 451 and the second switch 452 are discrete devices. In the embodiment, the metal conductive component 461 includes a slot 4610, and the clamping component 440 is accommodated in the slot 4610. Different from the power module 1v in FIG. 40, the power module 1x does not connect the first switch 451 and the second switch 452 through the trace on the metal-wiring layer of the carrier board 410. In the embodiment, the corresponding pad s of the first switch 451 and the second switch 452 are connected through the metal conductive component 461 out of the carrier board 410. Referring to FIG. 2B, in the embodiment, the corresponding polarity of the metal conductive component 461 is the O electrode, and the distance between the metal conductive component 461 and the P electrode or the N electrode under the clamping component 440 is relatively longer. In this way, the capacitor formed between the O electrode and the P electrode or the N electrode is small. The capacitor formed between the O electrode and the P electrode is a part of the output capacitance between the first pad T1 and the second pad T2 of the first switch 451. The capacitor formed between the O electrode and the N electrode is a part of the output capacitance between the firs pad T1' and the second pad T2' of the second switch 452. When the capacitor formed between the O electrode and the P electrode and the capacitor formed between the O electrode and the N pole is small, the switching losses of the first switch 451 and the second switch 452 are correspondingly small.

Figure 43:
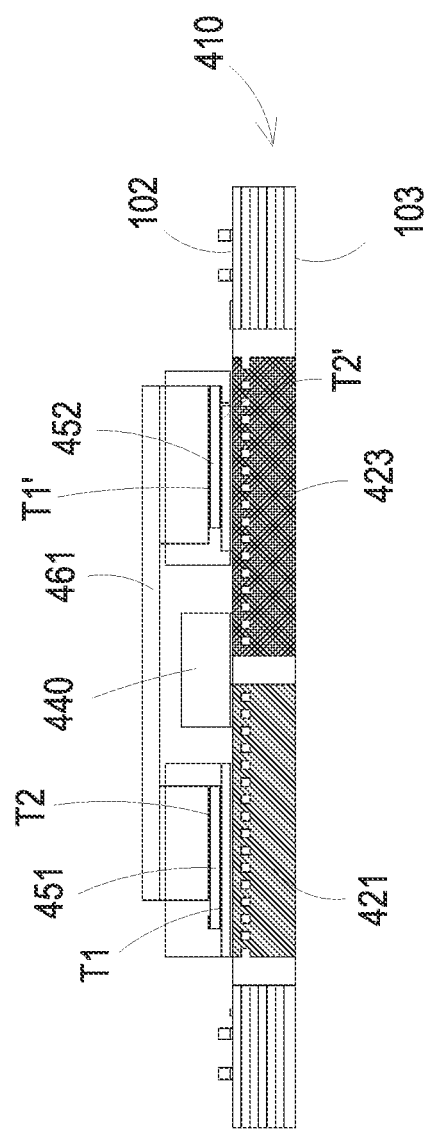
FIG. 43 is a schematic cross-sectional view illustrating a power module according to a thirty-first embodiment of the present disclosure.

FIG. 43 is a schematic cross-sectional view illustrating a power module according to a thirty-first embodiment of the present disclosure. In the embodiment, the structures, elements and functions of the power module 1y are similar to those of the power module 1x of FIG. 42, and are not redundantly described herein. In the embodiment, the first switch 451 and the second switch 452 are an integral switch assembly, and the second pad T2 of the first switch 451 and the first pad T1' of the second switch 452 are connected with each other through the metal conductive component 461 inside the switch assembly. The main part of the metal conductive component 461 has a longer longitudinal distance from the first metal block 421 connected to the P electrode and from the third metal block 423 connected to the N electrode. Therefore, the capacitor formed between the O electrode and the P electrode is small, the capacitor formed between the O electrode and the N electrode is small, and the switching losses of the first switch 451 and the second switch 452 are correspondingly small.

Figure 44:
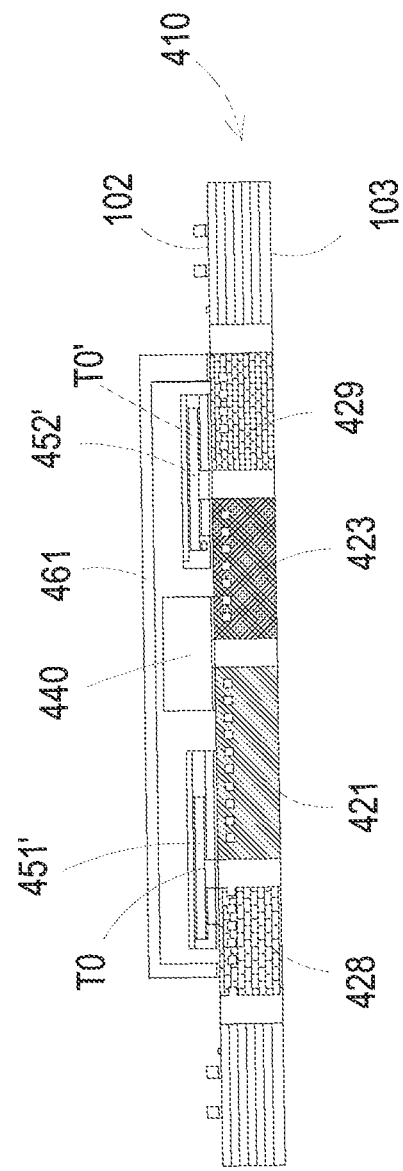
FIG. 44 is a schematic cross-sectional view illustrating a power module according to a thirty-second embodiment of the present disclosure.

FIG. 44 is a schematic cross-sectional view illustrating a power module according to a thirty-second embodiment of the present disclosure. In the embodiment, the structures, elements and functions of the power module 1z are similar to those of the power module 1v of FIG. 40, and are not redundantly described herein. In the embodiment, the first switch 451' and the second switch 452' are both planar devices with the functional surfaces T0, T0' facing the upper surface 102 of the carrier board 410. The first pad of the first switch 451' is connected to the first metal conductor 421, and the second pad of the first switch 451' is connected to an eighth metal block 428. The first pad of the second switch 452' is connected to a ninth metal block 429. The second pad of the second switch 452' is connected to the third metal block 423. The eighth metal block 428 and the ninth metal conductor 429 are connected through the metal conductive component 461. The first pad of the first switch 451' and the second pad of the second switch 452' are connected to the clamping component 440. The clamping component 440 is located between the first switch 451' and the second switch 452'. The longitudinal distance between the metal conductive component 461 located above the clamping component 440 and the first metal block 421 below the clamping component 440 is relatively long. Moreover, the longitudinal distance between the metal conductive component 461 located above the clamping component 440 and the third metal block 423 below the clamping component 440 is relatively long. The metal conductive component 461 is connected to the O electrode, the first metal block 421 is connected to the P electrode, and the third metal block 421 is connected to the N electrode. Therefore, the capacitance formed between the O electrode and the P electrode is small, and the capacitance formed between the O electrode and the N electrode is small. The switching losses of the first switch 451' and the second switch 452' are correspondingly small.

From the above descriptions, the present disclosure provides a carrier board and a power module using the same. By optimizing the arrangement of each component, the purpose of reducing the parasitic inductance and the EMI is achieved. It facilitates the power module structure to be assembled easily and firmly. At the same time, it is beneficial to reduce the volume of the power module and improve the entire power density of the power module. By utilizing a carrier board including two metal-wiring layers and at least one metal block to connect two switches in series to form a bridge arm, the area of the high-frequency loop is reduced, and the corresponding loop parasitic inductance is reduced. In addition, when the bridge arm formed by the two switches and a clamping component of the power module are electrically connected in parallel on the carrier board through the two metal-wiring layers, it is helpful for reducing the clamping inductance in the power module. With the at least one metal block embedded in the carrier board, it is more helpful for improving the heat dissipation performance of the power module. By partially overlapping the projections of the at least two metal-wiring layers, the at least one metal block and the two switches connected to each other in series on the surface of the carrier board, two high frequency loops decoupled from each other are formed, and the parasitic inductance in the two high-frequency loops is reduced. The current of one first high-frequency loop flows through the metal-wiring layer on the surface of the carrier board, and the current of another high-frequency loop crosses through the metal-wiring layer on the surface of the carrier board. Notably, the current that flows through the metal-wiring layer in the horizontal direction can be ignored. At least, the two high-frequency loops are partially decoupled, and the mutual influence is eliminated. Moreover, it is easy to realize the connection of the carrier board with the bridge arm including the two series-connection switches. It is beneficial for reducing the cost and enhancing the reliability. Since the bridge arm including two series-connection switches is disposed on the carrier board including at least one metal block embedded therein, it facilitates the power module to combine with two heat dissipation devices to achieve the double-sided heat dissipation and reduce the thermal resistance. Furthermore, the purposes of reducing the costs, enhancing the reliability of the power module and improving the heat-dissipation capacity are achieved. The metal-wiring layer on the surface of the carrier board can be realized with a thinner thickness, and combined with the metal block prefabricated and embedded within the carrier board to reduce the manufacturing costs and further enhance the reliability of the carrier board. When the two switches and the clamping component of the power module are directly disposed on the carrier board, it is beneficial for simplifying the assembly structure, reducing the cost, simplifying the manufacturing process, and improving the yield and reliability of the product. By arranging the metal conductive component on the side of the switches and the clamping component away from the carrier board, the metal conductive component is kept away from the trace of carrier board, which connects the switches and the clamping component to the positive terminal and the negative terminal therethrough, so that the output capacitance formed by the switches of the power module is reduced, and the parasitic inductances in the two high frequency loops are eliminated. An optimized power module is achieved. Moreover, the metal conductive component and the bridge arm including two switches connected in series can be prefabricated into an integrated structure, and the connection with the carrier board is easy to realize. It is beneficial for reducing the cost and enhancing the reliability. Two switches are connected to each other in series to form a bridge arm and disposed on the carrier board, and the bridge arm is formed by connecting two switches in series through the metal conductive component. Moreover, the bridge arm is connected with the clamping component in parallel through the carrier board, so as to form two high frequency loops decoupled from each other. Since the two high frequency loops are partially decoupled, the mutual influence is eliminated. Moreover, the metal-wiring layer on the surface of the carrier board can be realized with a thinner thickness, and combined with an integrated structure prefabricated by the metal conductive component and the two switches, so as to reduce the manufacturing costs. When the two switches and the metal conductive component of the power module are directly disposed on the carrier board, it is beneficial for simplifying the assembly structure, reducing the cost, simplifying the manufacturing process, and improving the yield and reliability of the product.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A carrier board, comprising:
    a main body comprising at least two terminals and at least one surface, wherein the at least two terminals are disposed on the at least one surface;
    at least two metal-wiring layers forming at least two parts of metal traces and connecting to the at least two terminals, respectively, wherein at least one of the two metal-wiring layers is disposed in the main body; and
    at least one metal block embedded in the main body and connected to one of the at least two terminals, wherein a thickness of the at least two parts of metal traces is less than a thickness of the at least one metal block, wherein the at least two terminals connected by the at least two parts of the metal traces have a loop inductance, which is less than or equal to 1.4 nH when the loop inductance is calculated at a frequency greater than 1 MHz.

2. The carrier board according to claim 1, wherein the at least two metal-wiring layers comprises a first metal-wiring layer and a second metal-wiring layer, and the at least one surface comprises an upper surface and a lower surface, wherein the first metal-wiring layer and the second metal-wiring layer are located at a side of the at least one metal block facing the upper surface.

3. The carrier board according to claim 2, further comprising a third metal-wiring layer, wherein the third metal-wiring layer is located at a side of the at least one metal block facing the lower surface, and at least one part of the third metal-wiring layer is equipotential with the at least one metal block.

4. The carrier board according to claim 2, further comprising a first thermal-conductive and insulating material, wherein the first thermal-conductive and insulating material is disposed on the lower surface.

5. The carrier board according to claim 1, wherein the at least one metal block is a prefabricated metal conductor and has a thickness greater than 0.3 mm.

6. The carrier board according to claim 1, wherein a projection of the at least one metal block on the at least one surface is at least partially overlapped with a projection of the at least two terminals on the at least one surface.

7. The carrier board according to claim 1, wherein the at least two terminals comprise at least three terminals disposed on the at least one surface, wherein the at least three terminals are configured to form a positive terminal, a negative terminal and an output terminal of a power module.

8. The carrier board according to claim 7, wherein the at least one metal block comprises a first metal block, a second metal block and a third metal block, wherein the second metal block is disposed between the first metal block and the third metal block, and the second metal block is connected to the output terminal.

9. The carrier board according to claim 7, wherein the power module comprises two switches connected to each other in series between the positive terminal and the negative terminal, and the output terminal is electrically connected to a common node of the two switches, wherein the at least two metal-wiring layers are located between the two switches and the at least one metal block.

10. A power module comprising: a carrier board comprising: a main body comprising at least two terminals, an upper surface and a lower surface, wherein the at least two terminals are disposed on the upper surface; at least two metal-wiring layers forming at least two parts of metal traces and connecting to the at least two terminals, respectively, wherein at least one of the two metal-wiring layers is disposed in the main body; and at least one metal block embedded in the main body and connected to one of the at least two terminals, wherein a thickness of the at least two parts of metal traces is less than a thickness of the at least one metal block; and two switches disposed on the upper surface and connected to each other in series through the at least two terminals to form a bridge arm, wherein a projection of the at least one metal block on the lower surface is at least partially overlapped with a projection of the two switches on the upper surface.

11. The power module according to claim 10, wherein the at least two terminals comprises at least three terminals, and the at least three terminals comprises a positive terminal, a negative terminal and an output terminal, wherein the bridge arm is electrically connected between the positive terminal and the negative terminal, and a common node of the two switches is electrically connected to the output terminal, wherein the at least two metal-wiring layers are located between the two switches and the at least one metal block.

12. The power module according to claim 10, further comprising a clamping component disposed on the upper surface and electrically connected in parallel with the bridge arm through the at least two metal-wiring layers, wherein the at least two metal-wiring layers are located between the clamping component and the at least one metal block.

13. The power module according to claim 12, wherein the clamping component is a capacitor.

14. The power module according to claim 10, wherein the at least two metal-wiring layers comprises a first metal-wiring layer and a second metal-wiring layer, and the first metal-wiring layer and the second metal-wiring layer are located at a side of the at least one metal block facing the upper surface.

15. The power module according to claim 14, wherein the carrier board further comprises a third metal-wiring layer, the third metal-wiring layer is located at a side of the at least one metal block facing the lower surface, and at least one part of the third metal-wiring layer is equipotential with the at least one metal block.

16. The power module according to claim 14, further comprising a clamping component, wherein the two switches comprise a first switch and a second switch, wherein the clamping component, the first switch and the second switch are disposed on the upper surface, wherein the clamping component is electrically connected in parallel with the bridge arm through the first metal-wiring layer and the second metal-wiring layer.

17. The power module according to claim 16, wherein the at least one metal block comprises a first metal block, a second metal block and a third metal block, and the first metal block, the second metal block and the third metal block spatially correspond to first switch, the clamping component and the second switch, respectively.

18. The power module according to claim 17, wherein the clamping component is located between the first switch and the second switch, and the second metal block is located between the first metal block and the third metal block.

19. The power module according to claim 17, wherein each of the first switch and the second switch comprises a first pad and a second pad, wherein the first pad of the first switch is connected to the first metal block, the second pad of the first switch is connected to the second metal block through the second metal-wiring layer, the first pad of the second switch is connected to the second metal block through the second metal-wiring layer, and the second pad of the second switch is connected to the third metal block.

20. The power module according to claim 17, wherein the first switch and the second switch are both vertical devices, the first switch is disposed on the carrier board with the first pad facing to the carrier board, and the second switch is disposed on the carrier board with the first pad facing away from the carrier board.

21. The power module according to claim 17, wherein a projection of the first switch on the lower surface of the carrier board is at least partially overlapped with a projection of the first metal block or the second metal block on the lower surface of the carrier board, and a projection of the second switch on the lower surface of the carrier board is at least partially overlapped with a projection of the second metal block or the third metal block on the lower surface of the carrier board.

22. The power module according to claim 17, wherein a thickness of the second metal block is less than a thickness of the first metal block or the third metal block.

23. The power module according to claim 17, wherein bottom heights of the first metal block, the second metal block and the third metal block are different.

24. The power module according to claim 17, further comprising:
a fourth metal block disposed on the lower surface of the carrier board, located under the first metal block, and connected to the first metal block;
a fifth metal block disposed on the lower surface of the carrier board, located under the second metal block, and connected to the second metal block; and
a sixth metal block disposed on the lower surface of the carrier board, located under the third metal block, and connected to the third metal block.

25. The power module according to claim 10, wherein the at least one metal block is a prefabricated metal conductor and has a thickness greater than 0.3 mm.

26. The power module according to claim 10, wherein the two switches are both planar devices or bare chips.

27. The power module according to claim 10, wherein the main body of the carrier board further comprising a first thermal-conductive and insulating material disposed on the lower surface of the carrier board.

28. The power module according to claim 10, wherein the carrier board further comprises a first connection portion, and the at least one metal block is connected to one of the at least two metal-wiring layers through the first connection portion, wherein the first connection portion and one of the at least two metal-wiring layers are located at the same layer.

29. The power module according to claim 10, wherein the carrier board further comprises a second connection portion, and the at least one metal block is connected to one of the at least two metal-wiring layers through the second connection portion, wherein the second connection portion comprises a parallel portion and a bending portion, and the bending portion is connected between the parallel portion and one of the at least two metal-wiring layers.

\* \* \* \* \*